(12) United States Patent
Katsuno et al.

(10) Patent No.: US 8,791,498 B2
(45) Date of Patent: Jul. 29, 2014

(54) SEMICONDUCTOR LIGHT EMITTING DEVICE AND METHOD FOR MANUFACTURING SAME

(75) Inventors: Hiroshi Katsuno, Tokyo (JP); Yasuo Ohba, Kanagawa-ken (JP); Kei Kaneko, Kanagawa-ken (JP); Mitsuhiro Kushibe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 514 days.

(21) Appl. No.: 12/719,464

(22) Filed: Mar. 8, 2010

(65) Prior Publication Data

US 2011/0049541 A1    Mar. 3, 2011

(30) Foreign Application Priority Data

Aug. 26, 2009 (JP) ................................ 2009-195936

(51) Int. Cl.
*H01L 33/00* (2010.01)

(52) U.S. Cl.
USPC ............. 257/101; 257/E33.043; 257/E33.063

(58) Field of Classification Search
CPC .......................... H04L 33/405; H04L 33/025
USPC ........................... 257/101, E33.043, E33.063
See application file for complete search history.

(56) References Cited

U.S. PATENT DOCUMENTS

| 7,019,323 | B2* | 3/2006 | Shakuda et al. ................. 257/98 |
| 7,176,479 | B2 | 2/2007 | Ohba | |
| 7,479,663 | B2* | 1/2009 | Urashima ....................... 257/98 |
| 7,615,794 | B2 | 11/2009 | Katsuno et al. | |
| 2003/0006409 | A1 | 1/2003 | Ohba | |
| 2008/0283850 | A1* | 11/2008 | Kamei ................... 257/E33.062 |
| 2009/0050916 | A1* | 2/2009 | Katsuno et al. ................. 257/98 |

FOREIGN PATENT DOCUMENTS

| JP | 7-254732 | 10/1995 |
| JP | 8-124706 | 5/1996 |
| JP | 9-326208 | 12/1997 |
| JP | 11-186600 | 7/1999 |
| JP | 2000-82843 | 3/2000 |
| JP | 2000-277802 | 10/2000 |
| JP | 2003-218470 A | 7/2003 |

(Continued)

OTHER PUBLICATIONS

U.S. Appl. No. 12/873,678, filed Sep. 1, 2010, Katsuno et al.

(Continued)

*Primary Examiner* — Stephen W Smoot
*Assistant Examiner* — Sun M Kim
(74) *Attorney, Agent, or Firm* — Oblon, Spivak, McClelland, Maier & Neustadt, L.L.P.

(57) ABSTRACT

A semiconductor light emitting device, includes: a stacked structural unit including a first semiconductor layer of a first conductivity type, a second semiconductor layer of a second conductivity type, and a light emitting layer provided therebetween; and an electrode including a first and second metal layers, the first metal layer including silver or silver alloy and being provided on a side of the second semiconductor layer opposite to the light emitting layer, the second metal layer including at least one element selected from gold, platinum, palladium, rhodium, iridium, ruthenium, and osmium and being provided on a side of the first metal layer opposite to the second semiconductor layer. A concentration of the element in a region including an interface between the first and second semiconductor layers is higher than that of the element in a region of the first metal layer distal to the interface.

30 Claims, 9 Drawing Sheets

(56) References Cited

FOREIGN PATENT DOCUMENTS

| | | |
|---|---|---|
| JP | 2004-281813 | 10/2004 |
| JP | 2005-117040 | 4/2005 |
| JP | 2005-340860 | 12/2005 |
| JP | 2006-156590 | 6/2006 |
| JP | 2006-245231 A | 9/2006 |
| JP | 2007-180504 A | 7/2007 |
| JP | 2007-518260 | 7/2007 |
| JP | 2008-135417 | 6/2008 |
| JP | 2008-171884 A | 7/2008 |
| JP | 2009-38331 | 2/2009 |
| JP | 2009-49266 | 3/2009 |
| WO | WO 2007/123355 A1 | 11/2007 |

OTHER PUBLICATIONS

U.S. Appl. No. 12/873,670, filed Sep. 1, 2010, Katsuno et al.
U.S. Appl. No. 13/601,800, filed Aug. 31, 2012, Ito, et al.
U.S. Appl. No. 13/204,021, filed Aug. 5, 2011, Katsuno, et al.
U.S. Appl. No. 12/505,053, filed Jul. 17, 2009, Kaneko, et al.
Office Action issued Sep. 24, 2013, in Japanese Patent Application No. 2012-015064, (with English-language Translation).
Office Action issued Dec. 1, 2011, in Japanese Patent Application No. 2009-195936 (with English-language translation).
Japanese Office Action Issued Jun. 17, 2013 in Patent Application No. 2012-015064 (with English translation).
Japanese Office Action Issued Jun. 17, 2013 in Patent Application No. 2012-015065 (with English translation).
Office Action issued May 7, 2012 in Japanese Application No. 2009-195936 (With English Translation).

* cited by examiner

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2009-195936, filed on Aug. 26, 2009; the entire contents of which are incorporated herein by reference.

BACKGROUND OF THE INVENTION

1. Field of the Invention

The invention relates to a semiconductor light emitting device and a method for manufacturing the same.

2. Background Art

To improve the light extraction efficiency of a semiconductor light emitting device such as an LED (Light Emitting Diode), it is desirable to use a material having a high reflectance as an electrode. Although silver and silver alloy have high reflecting characteristics even with respect to light emitted with short wavelengths of 400 nm or less and have good electrical characteristics such as ohmic characteristics and contact resistance, problems such as migration and chemical reactions easily occur and the adhesion is unfortunately poor.

In the case where sintering, for example, is performed to improve the adhesion, the reflecting characteristics easily deteriorate. Although configurations may be considered in which a metal layer is formed to cover a silver electrode after the silver electrode is formed, migration and chemical reactions occur in the silver electrode partway through processes of conventional methods; and the characteristics deteriorate. Even in the case where sintering is performed simultaneously on a protective film formed by a continuous film formation after the silver formation to protect the surface of the silver, the adhesion easily deteriorates in low temperature sintering; and the reflecting characteristics easily deteriorate in high temperature sintering.

Although JP-A 2009-49266 (Kokai) discusses a configuration to suppress the migration and chemical reactions of silver by providing, for example, a second metal film of Pt/Au excluding silver on a first metal film of silver or silver alloy, there is room for improvement to achieve better reflectance, electrical characteristics, stability, and adhesion.

SUMMARY OF THE INVENTION

According to an aspect of the invention, there is provided a semiconductor light emitting device, including: a stacked structural unit including a first semiconductor layer of a first conductivity type, a second semiconductor layer of a second conductivity type, and a light emitting layer provided between the first semiconductor layer and the second semiconductor layer, the first semiconductor layer including a nitride semiconductor, the second semiconductor layer including a nitride semiconductor; and an electrode including a first metal layer and a second metal layer, the first metal layer including silver or silver alloy and being provided on a side of the second semiconductor layer opposite to the light emitting layer, the second metal layer including at least one element selected from gold, platinum, palladium, rhodium, iridium, ruthenium, and osmium and being provided on a side of the first metal layer opposite to the second semiconductor layer, a concentration of the element in a region including an interface between the first metal layer and the second semiconductor layer being higher than a concentration of the element in a region of the first metal layer distal to the interface.

According to another aspect of the invention, there is provided a semiconductor light emitting device, including: a stacked structural unit including a first semiconductor layer of a first conductivity type, a second semiconductor layer of a second conductivity type, and a light emitting layer provided between the first semiconductor layer and the second semiconductor layer, the first semiconductor layer including a nitride semiconductor, the second semiconductor layer including a nitride semiconductor; and an electrode including a first metal layer and a second metal layer, the first metal layer including silver or silver alloy and being provided on a side of the second semiconductor layer opposite to the light emitting layer, the second metal layer including at least one element selected from gold, platinum, palladium, rhodium, iridium, ruthenium, and osmium and being provided on a side of the first metal layer opposite to the second semiconductor layer, the second semiconductor layer including an interface layer provided in contact with an interface between the second semiconductor layer and the first metal layer, the interface layer including silver.

According to another aspect of the invention, there is provided a method for manufacturing a semiconductor light emitting device, the device including: a stacked structural unit including a first semiconductor layer of a first conductivity type, a second semiconductor layer of a second conductivity type, and a light emitting layer provided between the first semiconductor layer and the second semiconductor layer, the first semiconductor layer including a nitride semiconductor, the second semiconductor layer including a nitride semiconductor; and an electrode provided on a side of the second semiconductor layer opposite to the light emitting layer, the method including: forming a first metal layer including silver or silver alloy on a surface of the second semiconductor layer on a side opposite to the light emitting layer and forming a second metal layer including at least one element selected from gold, platinum, palladium, rhodium, iridium, ruthenium, and osmium on the first metal layer; and sintering the second semiconductor layer, the first metal layer, and the second metal layer in an atmosphere containing oxygen, a temperature of the sintering causing an average particle diameter of the silver included in the first metal layer after the sintering to be not more than three times an average particle diameter of the silver prior to the sintering.

DETAILED DESCRIPTION OF THE INVENTION

Figure 1A:
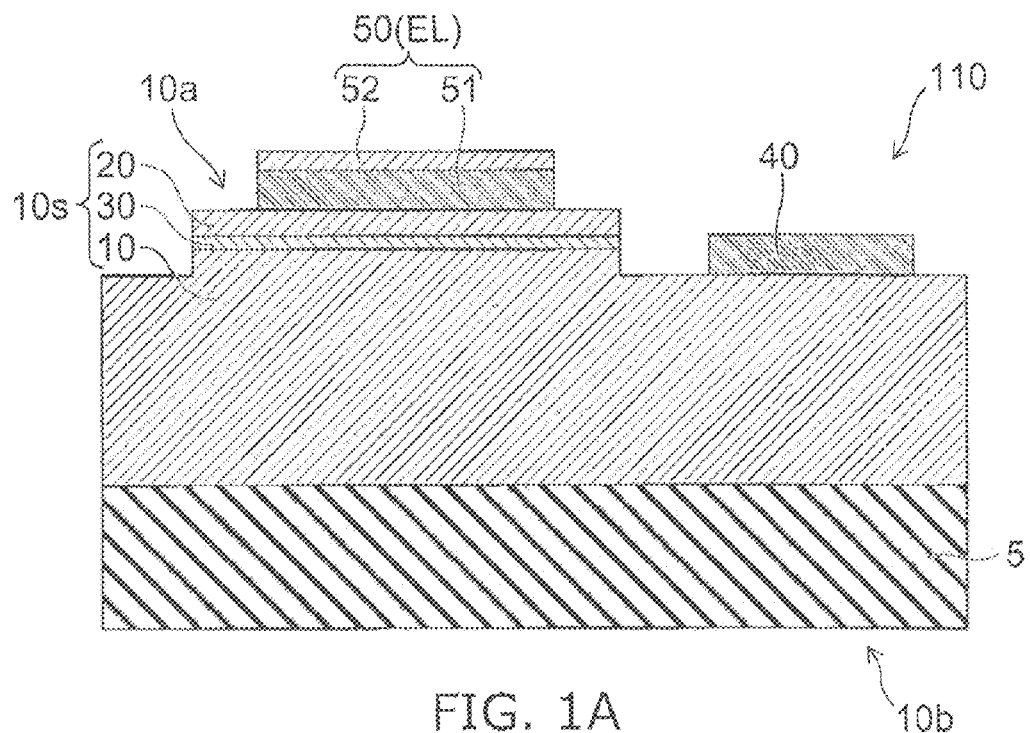
FIGS. 1A and 1B are schematic views illustrating a semiconductor light emitting device.

Embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

First Embodiment

Figure 1B:
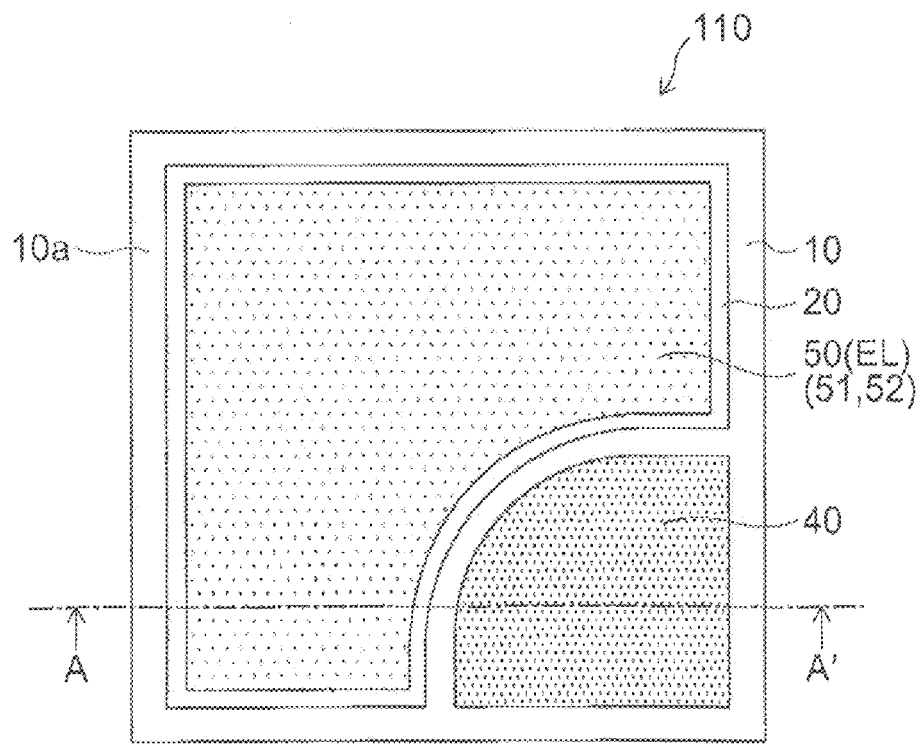

FIGS. 1A and 1B are schematic views illustrating the configuration of a semiconductor light emitting device according to a first embodiment of the invention.

Namely, FIG. 1B is a schematic plan view, and FIG. 1A is a cross-sectional view along line A-A' of FIG. 1B.

Figure 2A:
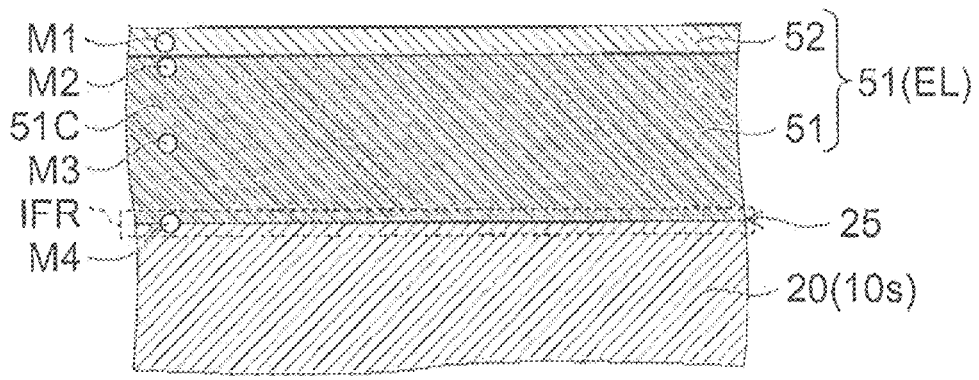
FIGS. 2A to 2C are schematic cross-sectional views illustrating the semiconductor light emitting device.
Figure 2B:
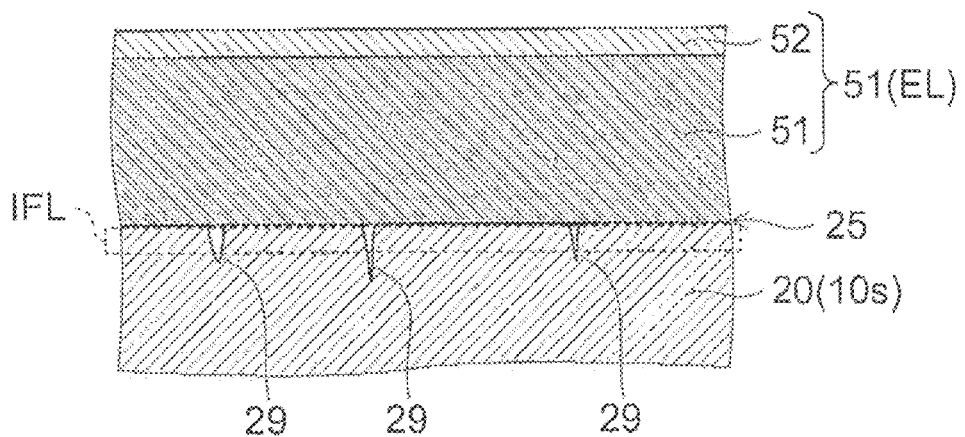
Figure 2C:
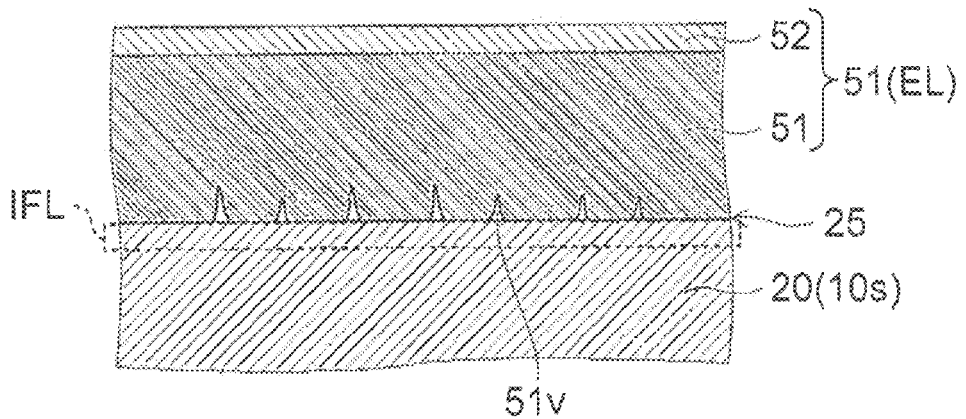

FIGS. 2A to 2C are schematic cross-sectional views illustrating the configuration of the semiconductor light emitting device according to the first embodiment of the invention.

Namely, FIGS. 2A to 2C illustrate enlarged portions of the cross section along line A-A' of FIG. 1B and illustrate three types of states of main components of a semiconductor light emitting device 110.

As illustrated in FIGS. 1A and 1B, the semiconductor light emitting device 110 according to this embodiment includes a stacked structural unit 10s and an electrode EL.

The stacked structural unit 10s includes a first semiconductor layer 10 of a first conductivity type including a nitride semiconductor, a second semiconductor layer 20 of a second conductivity type including a nitride semiconductor, and a light emitting layer 30 provided between the first semiconductor layer 10 and the second semiconductor layer 20.

The first conductivity type is, for example, an n-type. The second conductivity type is, for example, a p-type. However, the first conductivity type may be the p-type; and the second conductivity type may be the n-type. Hereinbelow, the case is described where the first conductivity type is the n-type and the second conductivity type is the p-type.

The electrode EL includes a first metal layer 51 and a second metal layer 52.

The first metal layer 51 is provided on a side of the second semiconductor layer 20 opposite to the light emitting layer 30 and includes silver (Ag) or silver alloy.

The second metal layer 52 is provided on a side of the first metal layer 51 opposite to the second semiconductor layer 20 and includes at least one element selected from gold (Au), platinum (Pt), palladium (Pd), rhodium (Rh), iridium (Ir), ruthenium (Ru), and osmium (Os). In the specification of the application, the phrase "at least one element selected from gold (Au), platinum (Pt), palladium (Pd), rhodium (Rh), iridium (Ir), ruthenium (Ru), and osmium (Os)" recited above is simply referred to as "noble metal element."

The electrode EL includes the first metal layer 51 stacked with the second metal layer 52. The first metal layer 51 and the second metal layer 52 contact each other. The first metal layer 51 contacts the second semiconductor layer 20.

The first metal layer 51 is, for example, a Ag layer with a thickness of, for example, 200 nm (nanometers). The second metal layer 52 is, for example, a Pt layer (platinum layer) with a thickness of 2 nm.

The Ag layer and the Pt layer recited above may be formed by, for example, a continuous formation and performing sintering (heat treatment), for example, at 380° C. for one minute in a mixed gas atmosphere having an oxygen to nitrogen ratio of 8 to 2.

As illustrated in FIG. 2A, the concentration of the noble metal element in an interface region IFR including an interface 25 between the first metal layer 51 and the second semiconductor layer 20 is higher than that of a first metal interior region 51c of the first metal layer 51 distal to the interface 25. Here, the first metal interior region 51c is a region of the first metal layer 51 distal to the interface 25 and includes a region proximal to the interface of the first metal layer 51 on the second metal layer 52 side.

As illustrated in FIG. 2B, the second semiconductor layer 20 includes an interface layer IFL including silver (Ag) and provided in contact with the interface 25 between the second semiconductor layer 20 and the first metal layer 51. In particular, silver is included in crystal defects 29 included in the interface layer IFL; and a compound layer of the second semiconductor layer 20 and silver is formed at the interface 25.

Such a configuration can maintain a high reflectivity of the first metal layer 51 including silver or silver alloy, have good electrical characteristics such as ohmic characteristics and contact resistance, provide high stability by suppressing migration and chemical reactions of the silver, and improve adhesion. Thereby, a semiconductor light emitting device can be provided to simultaneously satisfy high luminance, high efficiency, and high reliability.

The inventors performed sintering experiments with various conditions for a structure in which the first metal layer 51 including silver or silver alloy is provided on the second semiconductor layer 20, and the second metal layer 52 including the noble metal element is provided thereupon as the electrode EL. As a result, the inventors discovered that good characteristics such as those recited above are obtained when, as recited above, the noble metal element included in the second metal layer 52 is localized in the interface region IFR including the interface 25 between the second semiconductor layer 20 and the first metal layer 51 at the lower side of the first metal layer 51.

It may be conjectured that the noble metal element localized in the interface region IFR moved to the interface region IFR from the second metal layer 52 via the interior of the first metal layer 51. It may be considered that if such a phenomenon were a normal diffusion phenomenon, the region of the first metal layer 51 proximal to the second metal layer 52 would have a high concentration of the noble metal element; and the concentration of the noble metal element would decrease for regions distal to the second metal layer 52. However, according to the experimental results described below, the noble metal element was not detected in regions of the first metal layer 51 proximal to the second metal layer 52; the conditions at which the noble metal element is detected in the interface region IFR distal to the second metal layer 52 were discovered; and good characteristics were then obtained.

For such conditions, it was discovered that the interface layer IFL including Ag is formed in a portion of the second semiconductor layer 20 contacting the interface 25.

The invention was carried out based on the newly discovered knowledge recited above. The experimental results recited above are described below in detail.

Specific examples of the configuration of the semiconductor light emitting device 110 and examples of methods for manufacturing the same will now be described.

As illustrated in FIGS. 1A and 1B, a first electrode 40 is provided in contact with the first semiconductor layer 10; and a second electrode 50 is provided in contact with the second semiconductor layer 20.

In this specific example, the second electrode 50 includes the first metal layer 51 recited above and the second metal layer 52 recited above. In other words, the second electrode 50 is the electrode EL recited above.

The second semiconductor layer 20 may include multiple layers described below. Of such multiple layers, a layer (a contact layer described below) disposed on the side opposite to the light emitting layer 30 contacts the second electrode 50 (specifically, the first metal layer 51).

In this specific example, the first semiconductor layer 10 is exposed in a region where a portion of the second semiconductor layer 20 and the light emitting layer 30 on a first major surface 10a side of the stacked structural unit 10s is removed by, for example, etching; and the first electrode 40 is provided on the first semiconductor layer 10 in this region. The second electrode 50 is provided on the second semiconductor layer 20 of the first major surface 10a.

Also in this specific example, a substrate 5 may be provided on a side of the first semiconductor layer 10 opposite to the light emitting layer 30. In other words, the stacked structural unit 10s may be formed on the substrate 5 made of, for example, sapphire by providing a buffer layer (not illustrated) made of monocrystalline AlN and stacking the first semiconductor layer 10, the light emitting layer 30, and the second semiconductor layer 20 in this order thereupon.

For example, nitride semiconductors may be used as layers included in each of the first semiconductor layer 10, the light emitting layer 30, and the second semiconductor layer 20.

Specifically, a gallium nitride compound semiconductor such as, for example, $Al_xGa_{1-x-y}In_yN$ ($x \geq 0$, $y \geq 0$, and $x+y \leq 1$) may be used as the first semiconductor layer 10, the light emitting layer 30, and the second semiconductor layer 20. The formation methods of the first semiconductor layer 10, the light emitting layer 30, and the second semiconductor layer 20 are arbitrary. For example, methods such as metal organic chemical vapor deposition and molecular beam epitaxy may be used.

An example of the formation method of the stacked structural unit 10s will now be described.

First, a high carbon concentration first AlN buffer layer (e.g., having a carbon concentration of $3 \times 10^{18}$ cm$^{-3}$ to $5 \times 10^{20}$ cm$^{-3}$ and a thickness of 3 nm to 20 nm) as a buffer layer, a high purity second AlN buffer layer (e.g., having a carbon concentration of $1 \times 10^{16}$ cm$^{-3}$ to $3 \times 10^{18}$ cm$^{-3}$ and a thickness of 2 μm (micrometers)), and a non-doped GaN buffer layer (e.g., having a thickness of 3 μm) are sequentially formed in this order on the substrate 5. The first AlN buffer layer and the second AlN buffer layer recited above are monocrystalline aluminum nitride layers.

Thereupon, as the first semiconductor layer 10, a Si-doped n-type GaN layer (e.g., having a Si concentration of $1 \times 10^{18}$ cm$^{-3}$ to $5 \times 10^{18}$ cm$^{-3}$ and a thickness of 4 μm), a Si-doped n-type GaN contact layer (e.g., having a Si concentration of $5 \times 10^{18}$ cm$^{-3}$ to $1 \times 10^{20}$ cm$^{-3}$ and a thickness of 0.2 μm), and a Si-doped n-type $Al_{0.10}Ga_{0.90}N$ clad layer (e.g., having a Si concentration of $1 \times 10^{18}$ cm$^{-3}$ and a thickness of 0.02 μm) are sequentially formed in this order.

Thereupon, as the light emitting layer 30, three periods of a Si-doped n-type $Al_{0.11}Ga_{0.89}N$ barrier layer alternately stacked with a GaInN well layer are stacked, and a final $Al_{0.11}Ga_{0.89}N$ barrier layer of the multiple quantum well is stacked thereupon. In the Si-doped n-type $Al_{0.11}Ga_{0.89}N$ barrier layer, the Si concentration may be, for example, $1.1 \times 10^{19}$ cm$^{-3}$ to $1.5 \times 10^{19}$ cm$^{-3}$. The thickness of the final $Al_{0.11}Ga_{0.89}N$ barrier layer is, for example, 0.075 μm. Subsequently, a Si-doped n-type $Al_{0.11}Ga_{0.89}N$ layer (e.g., having a Si concentration of $0.8 \times 10^{19}$ cm$^{-3}$ to $1.0 \times 10^{19}$ cm$^{-3}$ and a thickness of 0.01 μm) is formed. The wavelength of the light emitted by the light emitting layer 30 is, for example, not less than 370 nm and not more than 400 nm, and more specifically, for example, not less than 370 nm and not more than 385 nm.

As the second semiconductor layer 20, a non-doped $Al_{0.11}Ga_{0.89}N$ spacer layer (e.g., having a thickness of 0.02 μm), a Mg-doped p-type $Al_{0.28}Ga_{0.72}N$ clad layer (e.g., having a Mg concentration of $1 \times 10^{19}$ cm$^{-3}$ and a thickness of 0.02 μm), a Mg-doped p-type GaN contact layer (e.g., having a Mg concentration of $1 \times 10^{19}$ cm$^{-3}$ and a thickness of 0.1 μm), and a high concentration Mg-doped p-type GaN contact layer (e.g., having a Mg concentration of $5 \times 10^{19}$ cm$^{-3}$ to $9 \times 10^{19}$ cm$^{-3}$ and a thickness of 0.02 μm) are sequentially formed in this order.

The compositions, composition ratios, impurity types, impurity concentrations, and thicknesses recited above are examples; and various modifications are possible.

The ohmic characteristics with the second electrode 50 can be improved by setting the Mg concentration of the high concentration Mg-doped p-type GaN contact layer to a high value of not less than $1 \times 10^{20}$ cm$^{-3}$ and less than $1 \times 10^{21}$ cm$^{-3}$. However, in the case of a semiconductor light emitting diode, there is a risk of deterioration of characteristics due to Mg diffusion because, unlike that of a semiconductor laser diode, the distance between the high concentration Mg-doped p-type GaN contact layer and the light emitting layer 30 is short. Therefore, by utilizing the large contact surface area between the second electrode 50 and the high concentration Mg-doped p-type GaN contact layer and the low current density during operations, the Mg concentration of the high concentration Mg-doped p-type GaN contact layer can be suppressed to the value not less than $1 \times 10^{19}$ cm$^{-3}$ and less than $1 \times 10^{20}$ cm$^{-3}$ without great electrical characteristic losses. Thereby, the diffusion of Mg can be prevented; and the light emission characteristics can be improved.

By using the first metal layer 51 and the second metal layer 52 recited above as the second electrode 50, it is possible to obtain good ohmic characteristics even in the case where the Mg concentration of the high concentration Mg-doped p-type GaN contact layer is suppressed to the value not less than $1 \times 10^{19}$ cm$^{-3}$ and less than $1 \times 10^{20}$ cm$^{-3}$.

The first AlN buffer layer acts to mitigate crystal type differences with the substrate 5 and particularly reduces screw dislocations.

The surface of the second AlN buffer layer is planarized at the atomic level. Thereby, crystal defects of the non-doped GaN buffer layer grown thereupon are reduced. To this end, it is favorable for the film thickness of the second AlN buffer layer to be thicker than 1 μm. Further, to prevent warp due to strain, it is favorable for the thickness of the second AlN buffer layer to be not more than 4 μm. Materials that may be used as the second AlN buffer layer are not limited to AlN. $Al_xGa_{1-x}N$ ($0.8 \leq x \leq 51$) may be used. Thereby, warp of the wafer can be compensated.

The non-doped GaN buffer layer performs the role of reducing crystal defects by being grown in a three dimensional island configuration on the second AlN buffer layer. The growth surface of the non-doped GaN buffer layer can be planarized by making the average film thickness of the non-doped GaN buffer layer not less than 2 μm. From the view-point of having reproducibility and reducing warp, an appropriate thickness of the non-doped GaN buffer layer is 4 μm to 10 μm.

Using such buffer layers can reduce crystal defects to about one-tenth of those of a low temperature growth AlN buffer layer. By such technology, high concentration Si doping of the n-type GaN contact layer (e.g., the Si-doped n-type GaN contact layer recited above) is possible; and it is possible to make a high efficiency semiconductor light emitting device emitting light even in the ultraviolet band. By reducing crystal defects in the buffer layers, the absorption of light by the buffer layers also can be suppressed.

In the case where an amorphous or multicrystal aluminum nitride layer is provided as a buffer layer to mitigate the crystal type difference between the substrate 5 made of sapphire and the stacked structural unit 10s formed thereupon, the buffer layer itself becomes a light absorbing body. Therefore, the light removal efficiency as a light emitting device undesirably decreases. Conversely, by forming the stacked structural unit 10s on the substrate 5 made of sapphire via the first AlN buffer layer and the second AlN buffer layer recited above which are monocrystalline aluminum nitride layers, crystal defects can be drastically reduced; and absorbing bodies in the crystal can be drastically reduced.

Thus, the semiconductor light emitting device 110 may further include the substrate 5 made of sapphire provided on the side of the light emitting layer 30 opposite to the second semiconductor layer 20 (the side of a second major surface 10b opposing the first major surface 10a). It is favorable for the light emitting layer 30 and the second semiconductor layer 20 (the stacked structural unit 10s) to be formed on the substrate 5 recited above via monocrystalline aluminum nitride layers (e.g., the first AlN buffer layer and the second AlN buffer layer recited above). At least a portion of the substrate 5 and the buffer layers recited above may be removed.

It is favorable for the aluminum nitride layers recited above to be provided on the substrate 5 side and include a portion having a carbon concentration relatively higher than that of the side opposite to the substrate 5. In other words, it is favorable for the first AlN buffer layer recited above to be provided on the substrate 5 side; and the second AlN buffer layer recited above to be provided on the side opposite to the substrate 5.

An example of the formation of the first electrode 40 and the second electrode 50 onto the stacked structural unit 10s recited above will now be described.

First, a portion of the second semiconductor layer 20 and the light emitting layer 30 is removed in a region of a portion of the first major surface 10a of the stacked structural unit 10s by, for example, dry etching using a mask to expose the n-type contact layer (e.g., the Si-doped n-type GaN contact layer recited above) at the surface.

Then, a patterned lift-off resist is formed on the exposed n-type contact layer; a Ti/Al/Ni/Au stacked film, for example, is formed using a vacuum vapor deposition apparatus; and the first electrode 40 is formed. The thickness of the Ti/Al/Ni/Au stacked film may be, for example, 300 nm. Then, sintering is performed at 650° C. in a nitrogen atmosphere.

Continuing, to form the second electrode 50, a patterned lift-off resist is formed on the p-type contact layer (e.g., the high concentration Mg-doped p-type GaN contact layer recited above). Using a vacuum vapor deposition apparatus, a Ag layer forming, for example, the first metal layer 51 is formed with a thickness of 200 nm; and then a Pt layer forming the second metal layer 52 is formed with a thickness of 2 nm. After the lift-off resist recited above is lifted off, sintering is performed at 380° C. for one minute in a mixed gas atmosphere having an oxygen to nitrogen ratio of 8 to 2.

The surface of the p-type contact layer is sufficiently dried prior to forming the Ag layer forming the first metal layer 51 because in the case where low amounts of moisture and ionic compounds are adhered to the p-type contact layer prior to forming the Ag layer, migration and grain growth of the Ag layer is promoted causing a shift from the optimal conditions.

Then, to cover the first electrode 40 and the second electrode 50, a Ti/Pt/Au stacked film, for example, is formed with a thickness of 500 nm.

Continuing, the semiconductor light emitting device 110 can be obtained by cutting the stacked structural unit 10s by cleaving, with a diamond blade, etc., and separating the devices.

As recited above, the second electrode 50 is formed on the second semiconductor layer 20 by continuously forming the Ag layer forming the first metal layer 51 with a thickness of 200 nm and the Pt layer forming the second metal layer 52 with a thickness of 2 nm and performing sintering at 380° C. for one minute in a mixed gas atmosphere having an oxygen to nitrogen ratio of 8 to 2.

The second electrode 50 thus formed has good adhesion, good ohmic characteristics, low contact resistance, and good electrical characteristics.

Because the second electrode 50 can be formed with a relatively low sintering temperature of, for example, about 380° C., grain growth of the Ag layer of the first metal layer 51 can be suppressed. Thereby, reflecting characteristics substantially as good as those of the Ag layer prior to sintering are obtained.

Thus, the second electrode 50 can be obtained to simultaneously satisfying high reflectance, good electrical characteristics, and good adhesion; and a semiconductor light emitting device can be provided to simultaneously satisfy high luminance, high efficiency, and high reliability.

Comparative Example

In a semiconductor light emitting device 119 (not illustrated) of a comparative example, a single-layer film of Ag is used as the second electrode 50. In other words, only the first metal layer 51 of the semiconductor light emitting device 110 is provided as the second electrode 50; and the second metal layer 52 is not provided. Otherwise, the configuration of the semiconductor light emitting device 119 is similar to that of the semiconductor light emitting device 110, and a description is therefore omitted.

During the manufacturing of the semiconductor light emitting device 119, when forming the second electrode 50, a patterned lift-off resist is formed on the p-type contact layer (the high concentration Mg-doped p-type GaN contact layer); a Ag layer forming, for example, the second electrode 50 is formed with a film thickness of 200 nm using a vacuum vapor deposition apparatus; the lift-off resist recited above is lifted off; and subsequently, sintering is performed at a temperature of 380° C. in a nitrogen atmosphere. Otherwise, the semiconductor light emitting element 119 is similar to the semiconductor light emitting device 110.

In the semiconductor light emitting device 119 of the comparative example, the average of the grain size of the Ag after sintering was greater than that prior to sintering by a factor of five or more; and the adhesion also was extremely poor.

Conversely, in the semiconductor light emitting device 110 according to this embodiment, a stacked structure of the first metal layer 51 (the Ag layer) and the second metal layer 52 (the Pt layer) is provided on the second semiconductor layer 20; and sintering is performed at 380° C. in an atmosphere including oxygen. Thereby, the noble metal element concentration of the interface region IFR can be higher than that of the first metal interior region 51c; and the interface layer IFL including Ag can be provided on the interface 25 side of the second semiconductor layer 20. Then, a high reflectivity of the first metal layer 51 including Ag can be maintained; the electrical characteristics are good; migration and chemical reactions of silver can be suppressed; the stability is high; and the adhesion can be improved.

Then, the second metal layer 52 supplies the noble metal element Pt that localizes in the interface 25; suppresses migration of the Ag included in the first metal layer 51; suppresses grain growth of the Ag; and protects the Ag layer. By such effects, higher luminance, higher efficiency, and a longer life of the semiconductor light emitting device can be provided and constraints on processes can be eliminated. Therefore, characteristics can be maximized and costs can be reduced.

In the semiconductor light emitting device 110 according to this embodiment, the improvement of the adhesion and the electrical characteristics may be considered to be mainly caused by the Pt included in the second metal layer 52 localizing in ultra trace amounts in the interface 25 between the second electrode 50 and the second semiconductor layer 20, and/or the Ag included in the first metal layer 51 diffusing into the second semiconductor layer 20 via crystal defects 29 such as cracks and dislocations by the sintering in an atmosphere including oxygen, and/or forming a compound layer between the second semiconductor layer 20 and the Ag included in the first metal layer 51 by the sintering in the atmosphere including oxygen. The state in which Pt is localized in the interface 25 between the second electrode 50 and the second semiconductor layer 20 may be considered to arise, for example, by Pt precipitating at the interface 25.

By appropriately setting the processing conditions of the second semiconductor layer 20, the thicknesses of the first metal layer 51 and the second metal layer 52, the sintering conditions, etc., the configuration illustrated in FIG. 2A can be formed in which the concentration of the noble metal element in the interface region IFR is higher than that of the first metal interior region 51c. In such a configuration, the first metal interior region 51c, for example, substantially does not include the noble metal element included in the second metal layer 52. In other words, the first metal layer 51 substantially does not include the noble metal element included in the second metal layer 52. In such a case, the amount of the noble metal element included in the first metal layer 51 (e.g., the first metal interior region 51c) is less than the detection limit.

For example, in the semiconductor light emitting device 110 constructed as recited above, the results of verifying the Ag existing in each of the regions by TEM-EDX analysis were as follows. Namely, Pt was detected at a first measurement point M1 corresponding to the interior of the second metal layer 52 illustrated in FIG. 2A. Pt was not detected and the concentration of Pt was less than the detection limit at a second measurement point M2 corresponding to a region of the first metal layer 51 on the second metal layer 52 side and at a third measurement point M3 corresponding to a region of the first metal layer 51 substantially central in the thickness direction. The second measurement point M2 and the third measurement point M3 are measurement points corresponding to the first metal interior region 51c. Pt was detected at a fourth measurement point M4 corresponding to the interface region IFR including the interface 25. In other words, the concentration of the noble metal element in the interface region IFR is higher than that of the first metal interior region 51c.

Pt has a high work function, good electrical characteristics such as ohmic characteristics with respect to the second semiconductor layer 20, and an adhesion with respect to the second semiconductor layer 20 better than that of Ag. However, Pt has poorer reflecting characteristics than Ag. Therefore, providing a Pt layer in contact with the second semiconductor layer 20 in a layer state having a certain thickness undesirably reduces the reflectance.

In the semiconductor light emitting device 110 according to this embodiment, rather than provide a Pt layer in contact with the second semiconductor layer 20 in a constant layer state, a low amount of Pt is localized in the interface region IFR including the interface 25 between the second semiconductor layer 20 and the first metal layer 51. Thereby, the electrical characteristics are good between the second semiconductor layer 20 and the second electrode 50; and a bond having good adhesion and reflecting characteristics can be realized.

For example, by using appropriate processing conditions, the noble metal element included in the second metal layer 52 can be precipitated in the interface region IFR including the interface 25 to localize a low amount of Pt in the interface region IFR.

By performing sintering in an atmosphere including oxygen, Ag easily diffuses into the second semiconductor layer 20 via, for example, the crystal defects 29 included in the second semiconductor layer 20; and the interface layer IFL including Ag can be provided, for example, in a region on the interface 25 side of the second semiconductor layer 20 illustrated in FIG. 2B. Further, by performing sintering in the atmosphere including oxygen, Ag easily forms a compound with the second semiconductor layer 20; and the interface layer IFL including Ag can be provided, for example, in a region on the interface 25 side of the second semiconductor layer 20 illustrated in FIG. 2B. It may be considered that the Ag diffusing to or compounding with the interface layer IFL improves the electrical characteristics and the adhesion.

The existence of the interface layer IFL including Ag, i.e., the localization of Ag in the region proximal to the interface 25 in the second semiconductor layer 20, can be verified by detecting the amount of Ag included proximally to the interface layer IFL (the region including the crystal defects 29) of the second semiconductor layer 20 and the amount of Ag included in the other regions of the second semiconductor layer 20 by, for example, cross-sectional TEM-EDX and the like. Also, by observing the region proximal to the interface 25 by, for example, cross-sectional TEM, it is possible to verify the lattice image of the second semiconductor layer 20 and the first metal layer 51 and the lattice image of the compound layer of the second semiconductor layer 20 and the Ag existing in the interface 25.

A sintering method to obtain the configuration recited above will now be described.

During the construction of the semiconductor light emitting device 110 according to this embodiment as described above, an electrically conducting layer forming the electrode EL (in this specific example, the second electrode 50) is formed on the second semiconductor layer 20. Subsequently, sintering (heat treatment) is performed at a relatively low temperature (e.g., 380° C.) in an atmosphere containing oxygen. Thereby, the interface between the second semiconductor layer 20 and the electrode EL can simultaneously have better adhesion, electrical characteristics, and reflecting characteristics.

Conversely, in the case of the comparative example in which sintering is not performed, the reflecting characteristics are relatively high, but the electrical characteristics are poor and the adhesion is markedly poor.

In the case where, for example, sintering is performed at a high temperature of about 560° C. in an atmosphere containing oxygen, the adhesion is good, but the electrical characteristics are poor and the reflecting characteristics markedly deteriorate. From the various experimental results by the inventors, it is apparent that reflecting characteristics decline as the grain size of the first metal layer 51 increases. It may be considered that migration of silver is promoted by the sintering at high temperatures; and the reflecting characteristics markedly decline due to the increase of the grain size.

Moreover, for example, for sintering at a low temperature (e.g., 380° C.) in an atmosphere containing nitrogen, the reflecting characteristics are good, but the electrical characteristics are not improved sufficiently and the adhesion markedly decreases.

Also, for example, for sintering at a high temperature (e.g., 560° C.) in a nitrogen atmosphere, the adhesion and the electrical characteristics are good, but the reflecting characteristics are poor.

Thus, the sintering used in this embodiment is performed at a relatively low temperature (e.g., 380° C.) in an atmosphere containing oxygen and simultaneously provides good adhesion, electrical characteristics, and reflecting characteristics.

Comparing the semiconductor light emitting device 110 of this embodiment to the method discussed in JP-A 2009-49266 (Kokai) in which a p-side electrode is obtained by forming a Ag layer on a p-type semiconductor layer, subsequently performing sintering at 380° C. for one minute in a nitrogen atmosphere, and subsequently forming a Pt/Au layer thereupon, the semiconductor light emitting device 110 has better overall performance of reflecting characteristics, electrical characteristics, and adhesion. In the comparative example, the noble metal elements of Pt and Au are not detected in the interface between the Ag layer and the p-type semiconductor layer. Further, Ag is not detected in the region of the region on the interface side of the p-type semiconductor layer.

It was found by experiment that the characteristics after sintering in an atmosphere containing oxygen change more sensitively than the characteristics after sintering in a nitrogen atmosphere in response to the crystal quality of the second semiconductor layer 20. It may be considered that in the case where the crystal quality of the second semiconductor layer 20 is poor, the load of the process of forming the second electrode 50 and the like cause an amplification of the crystal defects 29 in regions having low crystallinity; Ag diffuses further; and the crystal quality worsens. By repetitions thereof, the crystal quality acceleratingly declines, leading to reduced luminous efficacy. Therefore, to diffuse the Ag into the second semiconductor layer 20 and/or form a compound of the Ag and the second semiconductor layer 20 by oxygen sintering while suppressing the deterioration of the crystal quality, it is favorable to use the high quality second semiconductor layer 20 formed using the monocrystalline AlN buffer layers recited above (e.g., the first AlN buffer layer and the second AlN buffer layer recited above).

It may be considered that by appropriately setting the processing conditions of the second semiconductor layer 20, the thicknesses of the first metal layer 51 and the second metal layer 52, the sintering conditions, etc., the Pt localized in the interface region IFR plugs the crystal defects 29 of the surface of the second semiconductor layer 20 and suppresses deterioration of characteristics due to excessive diffusion of Ag.

For example, in a blue semiconductor light emitting device, problems caused by damage to the crystal due to Ag migration are not apparent. However, in a near-ultraviolet semiconductor light emitting device of 400 nm or less, the characteristics thereof are sensitive to the crystal quality; and the damage to the crystal due to the Ag migration cannot be ignored. In a single layer of Ag, the grain size is greater than that prior to heat treatment by a factor of at least three to five even at a low temperature of 380° C. or less. However, the surface of the Ag layer of the first metal layer 51 is covered with the Pt of the second metal layer 52. Thereby, substantially the same grain size as that prior to the heat treatment can be maintained even at relatively high temperatures of about 470° C.

By such effects in the semiconductor light emitting device 110, higher luminance, higher efficiency, and a longer life can be provided and constraints on processes can be mitigated. Therefore, characteristics can be maximized and costs can be reduced.

It was ascertained from the results of detailed analysis that in the semiconductor light emitting device 110, voids 51$v$ form on the interface 25 side of the first metal layer 51 and have widths not more than the light emission wavelength of the light emitting layer 30 as illustrated in FIG. 2C. For clarity in FIG. 2C, the voids 51$v$ are enlarged.

Due to the sintering, a low amount of migration occurs and the voids 51$v$ form in the region of the first metal layer 51 (the Ag layer) on the high concentration Mg-doped p-type GaN contact layer side. However, the Pt included in the second metal layer 52 precipitates in the interface 25 (particularly in the voids 51$v$ proximal to the interface). Thereby, migration in the interface 25 can be effectively suppressed.

Thereby, the voids 51$v$ form in the interface 25 while being suppressed from excessively growing and deforming due to migration; and the voids 51$v$ can be stabilized. The occurrence or nonoccurrence of the voids 51$v$, the width of the voids 51$v$, and the density of the voids 51$v$ can be controlled by the temperature, time, and oxygen concentration of the sintering and the thicknesses of the first metal layer 51 and the second metal layer 52.

The voids 51$v$ forming on the interface 25 side of the first metal layer 51 may reach the surface of the first metal layer 51 on the second metal layer 52 side and may pierce the first metal layer 51.

Such voids 51$v$ can change the optical path of the light emitted by the light emitting layer 30 to suppress optical confinement effects due to total internal reflections by the various interfaces having different refractive indexes; and the light extraction efficiency can be increased.

In other words, as light travels from the light emitting layer 30 toward the second electrode 50, the light incident on portions other than the voids 51$v$ undergoes a specular reflection according to geometrical optics. On the other hand, the light incident on the voids 51$v$ exhibits behavior described by wave optics such as scattering and diffraction because the width of the void 51$v$ is smaller than the light emission wavelength. As a result, at the voids 51$v$, phenomena of diffuse reflection including various angles different from the incidence angle occur instead of specular reflection. Thereby, the portion of light having a shallow incidence angle to the various interfaces (e.g., the interfaces of the first semiconductor layer 10 and the substrate 5, etc.) having different refractive indexes causing the light to be confined in the interior of the semiconductor light emitting device can have a changed incidence angle to efficiently extract light to the outside. Thereby, a semiconductor light emitting device having a high light extraction efficiency can be provided. Generally, the smaller the width of the void 51$v$ compared to the light emission wavelength, the higher the wavelike property of the light, and the more components of the light undergoing scatter reflection. As a result, the light extraction efficiency increases.

To maximize the effects of improving the light extraction efficiency by the voids 51v, it is favorable to optimize the conditions of the sintering and correct the configuration of the stacked structural unit 10s to match such conditions.

In other words, the experimental results show that the characteristics of the first semiconductor layer 10, the light emitting layer 30, and the second semiconductor layer 20 change sensitively with variations in the conditions of the sintering recited above. For example, the internal quantum efficiencies of the first semiconductor layer 10, the light emitting layer 30, and the second semiconductor layer 20 decrease depending on the conditions of the sintering. By simultaneously optimizing the sintering conditions and the thickness, impurity concentration, compositions, etc., of each of the first semiconductor layer 10, the light emitting layer 30, and the second semiconductor layer 20, the luminance, efficiency, and life of the semiconductor light emitting device can be further improved.

Experimental results will now be described regarding changes in various characteristics when changing the sintering conditions.

Figure 3:
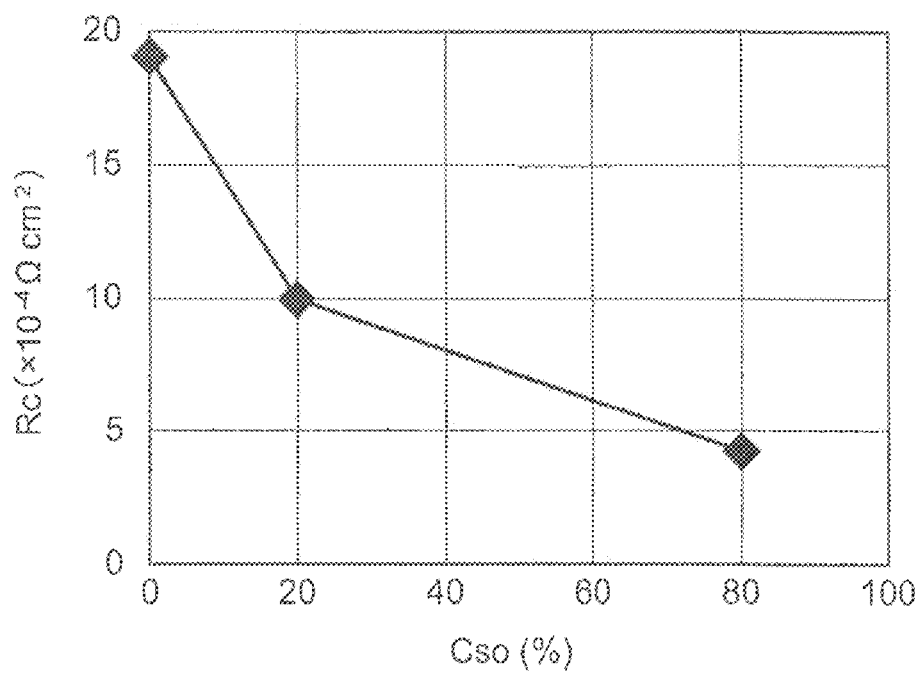
FIG. 3 is a graph illustrating characteristics of the semiconductor light emitting device.

FIG. 3 is a graph illustrating characteristics of the semiconductor light emitting device according to the first embodiment of the invention.

Namely, semiconductor light emitting devices were constructed with different oxygen concentrations of the atmospheres during sintering. FIG. 3 illustrates the results of measuring the contact resistance between the second semiconductor layer 20 and the second electrode 50. An oxygen concentration Cso during the sintering is plotted on the horizontal axis. A contact resistance Rc is plotted on the vertical axis. The oxygen concentration Cso is the ratio of the oxygen in the gas entirety. For example, in the case where the oxygen to nitrogen ratio is 8 to 2, the oxygen concentration Cso is 80%.

As illustrated in FIG. 3, the contact resistance Rc gradually increases as the oxygen concentration Cso decreases below 80%. As the oxygen concentration Cso decreases from 20% to 0% (a nitrogen atmosphere), the contact resistance increases by a factor of two.

Although Schottky properties substantially were not observed for oxygen concentrations Cso in the range of 80% to 20%, Schottky properties albeit slight were observed in the case of an oxygen concentration Cso of 0% (a nitrogen atmosphere).

Thus, the oxygen concentration Cso has a great effect on the decrease of the contact resistance Rc and the ohmic characteristics; and it is favorable for the oxygen concentration Cso to be not less than 20% and not more than 100%. Thereby, the contact resistance Rc can be reduced; and good ohmic characteristics can be obtained. In the case where the oxygen concentration Cso is lower than 20%, the contact resistance Rc increases; and electrical characteristics having Schottky properties appear.

Figure 4A:
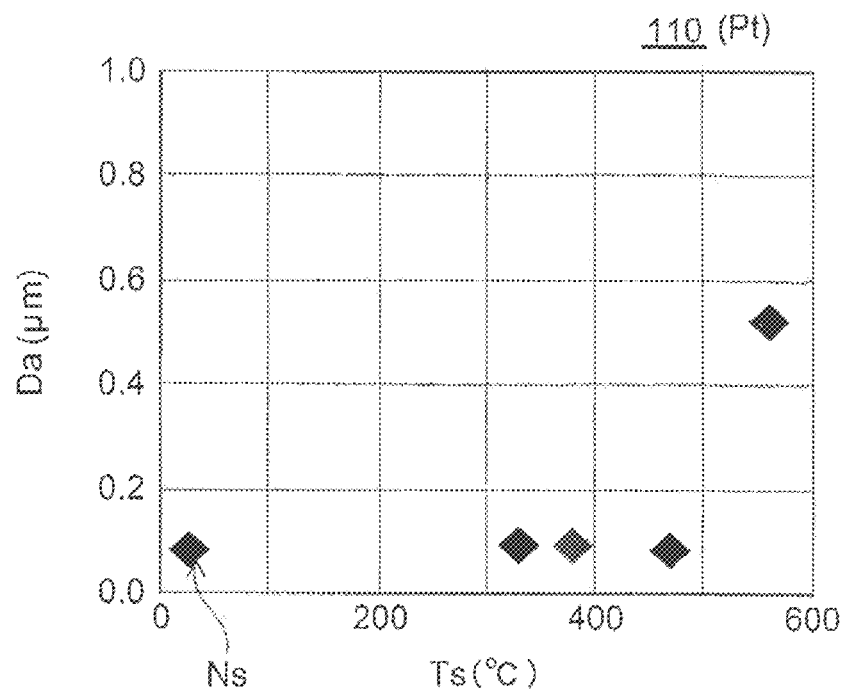
FIGS. 4A and 4B are graphs illustrating characteristics of the semiconductor light emitting device.
Figure 4B:
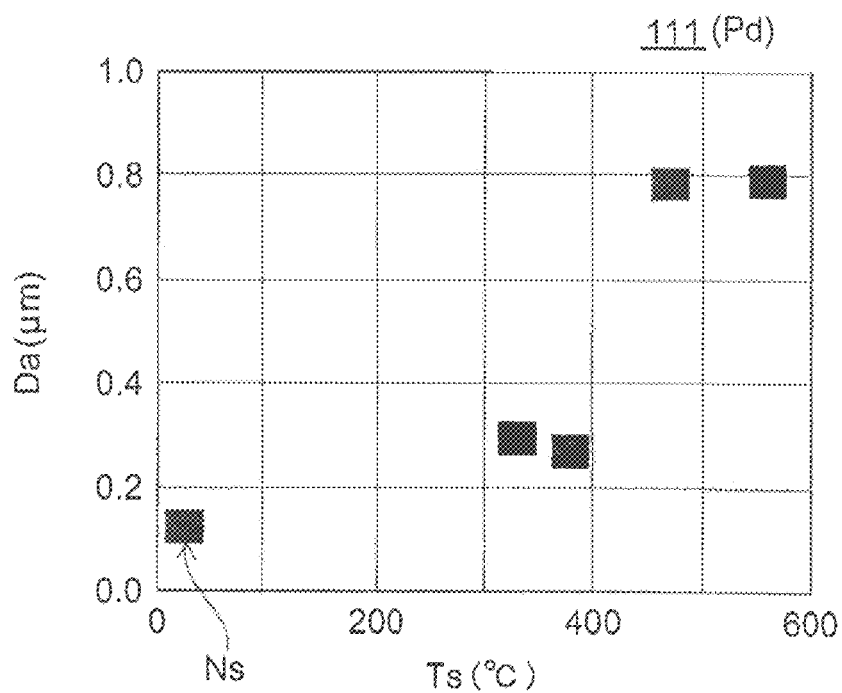

FIGS. 4A and 4B are graphs illustrating characteristics of the semiconductor light emitting device according to the first embodiment of the invention.

Namely, semiconductor light emitting devices were constructed with different temperatures during the sintering. FIGS. 4A and 4B illustrate the results of the evaluations of the grain size of the Ag included in the first metal layer 51 of the second electrode 50. A sintering temperature Ts is plotted on the horizontal axis. A grain size Da is plotted on the vertical axis. The plots in the graphs at the sintering temperature Ts of 25° C. correspond to a sample Ns for which sintering was not performed.

In these experiments, evaluations were performed for both the configuration of the semiconductor light emitting device 110 using Pt as the second metal layer 52 and the configuration of a semiconductor light emitting device 111 using Pd as the second metal layer 52. Other than using Pd as the second metal layer 52, the semiconductor light emitting device 111 has the same configuration as the semiconductor light emitting device 110.

The grain size Da referred to herein is the average value of measurements of the size (the longest diameter of one grain) of multiple grains by SEM observation of the surface of the first metal layer 51 and the second metal layer 52 after forming the films that form the first metal layer 51 and the second metal layer 52 (prior to the sintering) or after the sintering is performed at the prescribed temperature after the film formation. In other words, the grain size Da is an average particle diameter. Because the particle diameter of the noble metal element (particularly the particle diameters of Pt and Pd) is sufficiently smaller than the grain size of Ag, the grain sizes evaluated by the method recited above may be considered to be substantially the grain size of the Ag.

In this experiment, the oxygen concentration Cso during the sintering was 80%.

For the semiconductor light emitting device 110 using Pt as the second metal layer 52, the grain sizes Da for sintering temperatures Ts of 330° C., 380° C., and 470° C. are substantially the same as that of the sample Ns for which sintering is not performed as illustrated in FIG. 4A. Conversely, the grain size Da for a sintering temperature Ts of 560° C. increases to at least six times that of the sample Ns for which sintering is not performed.

As illustrated in FIG. 4B, the semiconductor light emitting element 111 using Pd as the second metal layer 52 also exhibits similar trends. For sintering temperatures Ts of 330° C. and 380° C., the grain sizes Da are about 2.5 times the grain size Da of the sample Ns for which sintering is not performed. However, for sintering temperatures Ts of 470° C. and 560° C., the grain sizes Da increase to at least six times the grain size Da of the sample Ns for which sintering is not performed.

On the other hand, as described above, for the semiconductor light emitting device 119 of the comparative example using only a Ag layer as the second electrode 50, the sintering temperature Ts is 380° C. In such a case, the grain size Da increases to about five times that of the sample for which sintering is not performed. Further, for such a configuration, increasing the sintering temperature Ts to 470° C. increases the grain size Da to at least six times that of the sample for which sintering is not performed.

These experimental results show that the grain size Da does not easily increase even in the temperature range of 380° C. to 470° C. by using the stacked structure of the Ag layer of the first metal layer 51 and the second metal layer 52 including Pt or Pd formed continuously thereupon as the second electrode 50. In the temperature range of 380° C. to 470° C., the grain size Da is 0.3 μm or less. For the ranges thereabove, the grain size Da is 0.6 μm to 0.8 μm.

Further, the evaluation results of the samples of these experiments and the other experimental results show a trend of the contact resistance Rc increasing as the grain size increases. It was also shown that increasing the grain size Da causes a decline of the reflecting characteristics.

As illustrated in FIGS. 4A and 4B, the grain size Da abruptly increases from a sintering temperature Ts of 560° C. in the case where the second metal layer 52 includes Pt and abruptly increases from a sintering temperature Ts of 470° C. in the case where the second metal layer 52 includes Pd. Accordingly, it is favorable to use conditions for which the grain size Da does not abruptly increase.

In other words, in the case where the grain size Da (the average particle diameter) of the first metal layer 51 is 0.3 µm or less, a low contact resistance Rc can be obtained and high reflecting characteristics can be obtained.

For the cases where the second metal layer is either Pt or Pd, good ohmic characteristics were obtained for sintering temperatures Ts of 330° C. or more. Thus, good ohmic characteristics can be obtained with sintering using a relatively high oxygen concentration Cso of, for example, 80% even with a relatively low sintering temperature Is of about 330° C.

Also, for the cases where the second metal layer is either Pt or Pd, the adhesion is good for sintering temperatures Ts of 330° C. or more.

From the results recited above, it is favorable for the sintering temperature Ts to be less than 560° C. and particularly favorable to be not more than 470° C. in the case where the second metal layer 52 includes Pt. In the case where the second metal layer 52 includes Pd, it is favorable for the sintering temperature Ts to be less than 470° C. and particularly favorable to be not more than 380° C.

In such a case, the grain size Da after the sintering is one to three times the grain size Da prior to the sintering (the case where sintering is not performed). In other words, it is favorable for the sintering temperature Ts to be lower than the temperature at which the grain size Da is more than three times the grain size Da prior to the sintering.

For such conditions, the grain size Da (the average particle diameter) of the first metal layer 51 is not more than 0.3 µm.

When the conditions recited above are used, good characteristics can be obtained on all points of the reflecting characteristics, the contact resistance Rc, the ohmic characteristics, and the adhesion.

It is favorable for the sintering temperature Ts to be higher than the maximum temperature of the processes after forming the second electrode 50 (and in some cases the first electrode 40) and higher than the temperature when mounting the semiconductor light emitting device onto a submount, heat sink, and the like. For example, in the case where the semiconductor light emitting device 110 using Pt as the second metal layer 52 is mounted onto a submount with AuSn solder, it is favorable for the sintering temperature Ts to be higher than the melting point of AuSn solder of 280° C. and lower than 560° C. For example, in the case where the semiconductor light emitting device 111 using Pd as the second metal layer 52 is fixed to a heat sink by low temperature mounting at about 150° C., it is favorable for the sintering temperature Ts to be higher than 150° C. and lower than 470° C.

Any material may be used as the substrate 5 in the semiconductor light emitting device according to this embodiment. For example, materials such as sapphire, SiC, GaN, GaAs, Si, and the like may be used as the substrate 5.

The first metal layer 51 includes at least Ag or an alloy including Ag.

Although there is a trend for the reflectance with respect to the visible light band of a single-layer film of metals other than Ag and Al to decrease as the wavelength shortens in the ultraviolet region of 400 nm or less, Ag has good reflecting characteristics with respect to light in the ultraviolet band of 370 nm to 400 nm. Therefore, in the case of a semiconductor light emitting device for ultra-violet light having a first metal layer 51 of Ag alloy, it is favorable for the component ratio of Ag in the region of the first metal layer 51 on the interface 25 side to be high. It is favorable for the thickness of the first metal layer 51 to be not less than 100 nm to ensure the reflectance with respect to the light.

Ag and Pt have a solid solution relationship; and it is considered that the Pt proximal to the interface with the Ag mixes with the Ag in the region within several nm from the interface due to sintering and thereby can suppress migration of the Ag. In particular, Pd is a complete solid solution with Ag. Therefore, by using Pd as the second metal layer 52, migration of the Ag can be effectively suppressed. By using a combination of the first metal layer 51 including Ag and the second metal layer 52 including the noble metal element of Pt, Pd, etc., high reliability can be obtained also when injecting a high current.

Second Embodiment

Figure 5:
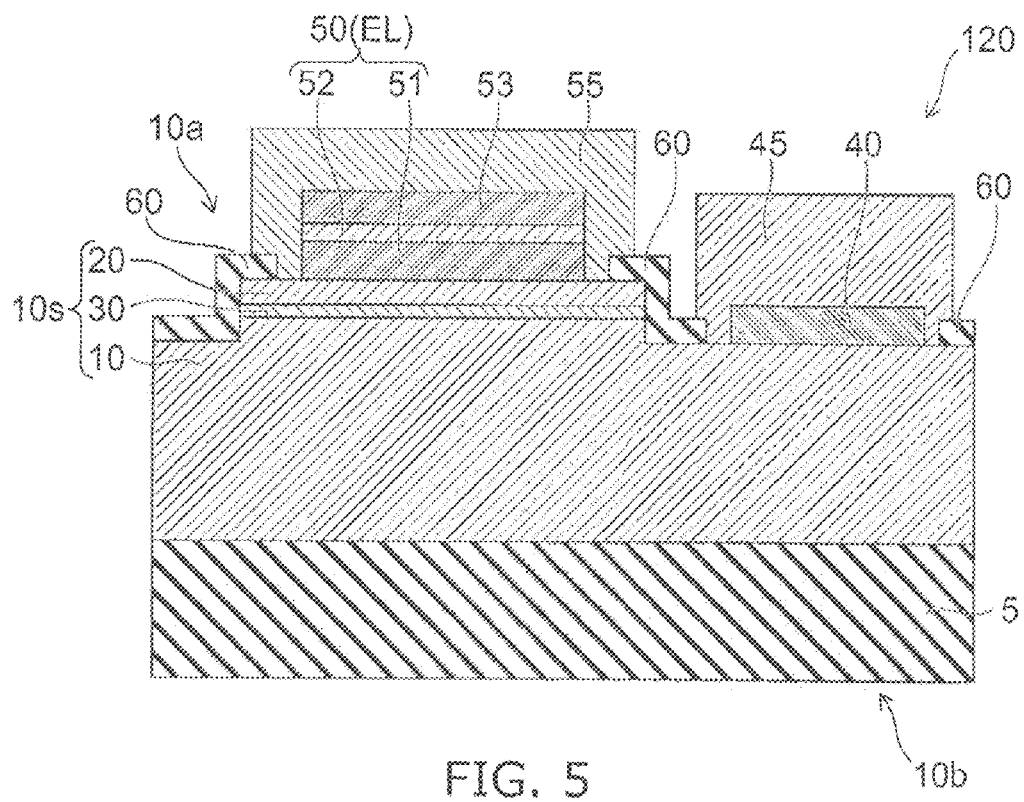
FIG. 5 is a schematic cross-sectional view illustrating a semiconductor light emitting device.

FIG. 5 is a schematic cross-sectional view illustrating the configuration of a semiconductor light emitting device according to a second embodiment of the invention.

Namely, FIG. 5 illustrates the configuration of a semiconductor light emitting device 120 according to this embodiment and is a cross-sectional view corresponding to a cross section along line A-A' of FIG. 1B.

In the semiconductor light emitting device 120, a dielectric film 60 is provided in a circumferential edge region of the first electrode 40 and the second electrode 50 on the surface of the first major surface 10a side of the first semiconductor layer 10 and the second semiconductor layer 20 as illustrated in FIG. 5. A first pad layer 45 is provided on the first electrode 40. A diffusion prevention layer 53 is provided on the second electrode 50; and a second pad layer 55 is provided thereupon.

The semiconductor light emitting device 120 having such a configuration may be constructed, for example, as follows.

After forming the stacked structural unit 10s similarly to that of the semiconductor light emitting device 110, a portion of the second semiconductor layer 20 and the light emitting layer 30 is removed in a region of a portion of the first major surface 10a of the stacked structural unit 10s to expose the n-type contact layer (e.g., the Si-doped n-type GaN contact layer recited above) at the surface.

Then, a SiO$_2$ film forming the dielectric film 60 is formed on the first major surface 10a of the stacked structural unit 10s with a thickness of 400 nm using a thermal CVD apparatus.

Continuing, to form the first electrode 40, a patterned lift-off resist is formed on the n-type contact layer; and a portion of the SiO$_2$ film recited above on the exposed n-type contact layer is removed by ammonium fluoride processing. A Ti/Al/Ni/Au stacked film, for example, is formed with a thickness of, for example, 300 nm in the region where the SiO$_2$ film is removed using a vacuum vapor deposition apparatus; and after lift-off, sintering is performed at 650° C. in a nitrogen atmosphere.

Then, to form the second electrode 50 similarly to the first electrode 40, a patterned lift-off resist is formed on the p-type contact layer (e.g., the high concentration Mg-doped p-type GaN contact layer recited above); and the p-type contact layer is exposed by ammonium fluoride processing. At this time, the processing time of the ammonium fluoride processing is adjusted to expose the p-type contact layer between the second electrode 50 and the SiO$_2$ film forming the dielectric film 60. As a specific example, in the case of an etching rate of 400 nm/minute, the total of the time for removing the SiO$_2$ film in the region where the second electrode 50 is formed and the time of the over-etching to expose the p-type contact layer proximal to the region recited above with a width of 1 µm is about three minutes.

A Ag layer, for example, is formed with a thickness of 200 nm in the region where the SiO$_2$ film is removed using a vacuum vapor deposition apparatus; a Pt layer having a thickness of 2 nm is formed continuously with the forming of the Ag layer; and after lift-off, sintering is performed at 380° C. for one minute in a mixed gas atmosphere having an oxygen to nitrogen ratio of 8 to 2.

Then, as the diffusion prevention layer 53, lift-off is used to form, for example, five sets of stacked films combining Pt films and W films on the second electrode 50 (to cover the second electrode 50). The thickness of the diffusion prevention layer 53 is, for example, 600 nm.

A Ti/Pt/Au stacked film, for example, with a thickness of 1000 nm is formed as the first pad layer 45 and the second pad layer 55 by lift-off to cover a portion of the dielectric film 60 while covering the first electrode 40, the second electrode 50, and the diffusion prevention layer 53, respectively.

By forming the dielectric film 60 on the stacked structural unit 10s prior to forming the ohmic metals of the second electrode 50 (the first metal layer 51 and the second metal layer 52) and the first electrode 40 as recited above, it is possible to drastically suppress contamination adhering to the interface between the electrodes and the stacked structural unit 10s during the electrode formation processes. Therefore, the reliability, yield, electrical characteristics, and optical characteristics can be improved.

By performing oxygen sintering of the second electrode 50 after forming the dielectric film 60, it is possible to fill oxygen defects of the $SiO_2$ film formed by the thermal CVD apparatus.

When using sputtering and the like instead of thermal CVD to form a good film as the dielectric film 60 having few oxygen defects, the characteristics of the semiconductor light emitting device deteriorate in some cases due to residual stress of the dielectric film 60. In particular, such a phenomenon is evident in the case where the quality of the crystal of the stacked structural unit 10s is poor. Accordingly, it is easy to obtain a semiconductor light emitting device having good characteristics by a method that forms a thermal CVD film having many oxygen defects and somewhat poor quality and subsequently fills the oxygen defects.

Because the second electrode 50 is isolated from air by being covered with the diffusion prevention layer 53 and the second pad layer 55, the second electrode 50 is not easily exposed to moisture and ionic impurities; and migration, oxidization, and sulfidization reactions of the second electrode 50 can be suppressed.

The second pad layer 55 is formed in a region proximal to the end portion of the second electrode 50 on the side where the second electrode 50 and the first electrode 40 oppose each other; and a current path is formed in this region. Therefore, current concentration in the second electrode 50 is mitigated. Simultaneously, a region of the dielectric film 60 (or a dielectric stacked film) proximal to the end portion of the dielectric film 60 in the region where the second electrode 50 and the first electrode 40 oppose each other is interposed between the second semiconductor layer 20 and the second pad layer 55. Therefore, a weak electric field is applied between the second semiconductor layer 20 and the second pad layer 55 on either side of the dielectric film 60 (or a dielectric stacked film). As a result, a structure can be made in which the electric field gradually weakens from the second electrode 50 toward the dielectric film 60 (or a dielectric stacked film). Therefore, electric field concentration in such a region can be mitigated.

Further, no new special contrivances are necessary in the manufacturing processes of the semiconductor light emitting device 120; and the same processes and number of processes as conventional art may be used.

Thereby, the semiconductor light emitting device 120 can realize reduced leak current, improved insulating characteristics, improved breakdown voltage characteristics, improved light emission intensity, longer life, high throughput, and low costs.

Although it is advantageous for the lengths of the pads (the first pad layer 45 and the second pad layer 55) covering the dielectric film 60 (or a dielectric stacked film) to be long to obtain an electric field mitigation structure in which the dielectric film 60 (or a dielectric stacked film) is interposed, there is a higher risk that a short may occur between the second electrode 50 and the first electrode 40. On the other hand, in the case where the lengths are short, there is less risk that a short may occur between the second electrode 50 and the first electrode 40.

The diffusion prevention layer 53 provided between the second electrode 50 and the second pad layer 55 suppresses diffusion of the elements included in the second pad layer 55 toward the second electrode 50 and/or reactions of such elements with elements included in the second electrode 50. The diffusion prevention layer 53 may include, in particular, a material that does not react with the Ag included in the first metal layer 51 of the second electrode 50 and/or does not diffuse actively in the Ag.

Materials used in the diffusion prevention layer 53 may include, for example, a single-layer film or a stacked film including a refractory metal such as vanadium (V), chrome (Cr), iron (Fe), cobalt (Co), nickel (Ni), niobium (Nb), molybdenum (Mo), ruthenium (Ru), rhodium (Rh), tantalum (Ta), tungsten (W), rhenium (Re), iridium (Ir), and platinum (Pt).

In particular, to avoid problems even when some diffusion occurs, it is more favorable to use a metal as the diffusion prevention layer 53 that has a high work function and easily provides ohmic characteristics with respect to the p-type GaN contact layer (e.g., the high concentration Mg-doped p-type GaN contact layer recited above) such as iron (Fe), cobalt (Co), nickel (Ni), rhodium (Rh), tungsten (W), rhenium (Re), iridium (Ir), and platinum (Pt).

In the case of a single-layer film, it is favorable for the thickness of the diffusion prevention layer 53 to be in the range of 5 nm to 200 nm to maintain the film state. In the case of a stacked film, the thickness of the diffusion prevention layer 53 is not particularly limited and may be selected, for example, between 10 nm to 10,000 nm.

Third Embodiment

Figure 6:
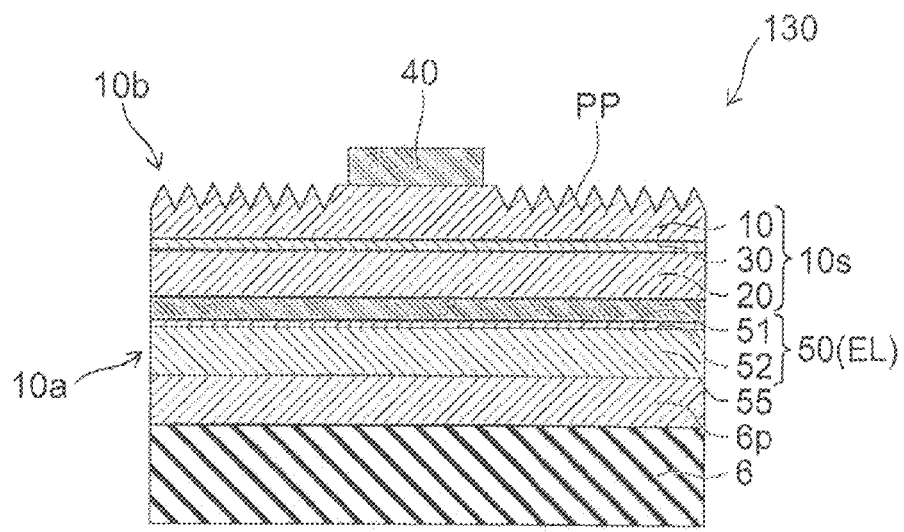
FIG. 6 is a schematic cross-sectional view illustrating a semiconductor light emitting device.

FIG. 6 is a schematic cross-sectional view illustrating the configuration of a semiconductor light emitting device according to a third embodiment of the invention.

Namely, FIG. 6 is a cross-sectional view of a semiconductor light emitting device 130 cut in the stacking direction of the stacked structural unit 10s of the semiconductor light emitting device 130.

In the semiconductor light emitting device 130 according to this embodiment, the second electrode 50 is provided on the first major surface 10a side of the stacked structural unit 10s; and the first electrode 40 is provided on the second major surface 10b side opposing the first major surface 10a as illustrated in FIG. 6. In such a case, the stacked structural unit 10s is grown as a crystal on, for example, the substrate 5 made of sapphire; and the substrate 5 is subsequently removed.

A recess/protrusion portion PP is provided on the second major surface 10b of the stacked structural unit 10s in a region where the first electrode 40 is not provided. The recess/protrusion portion PP can reflect the light emitted by the light emitting layer 30 to increase the light extraction efficiency.

The semiconductor light emitting device 130 having such a configuration may be manufactured, for example, as follows.

Figure 7A:
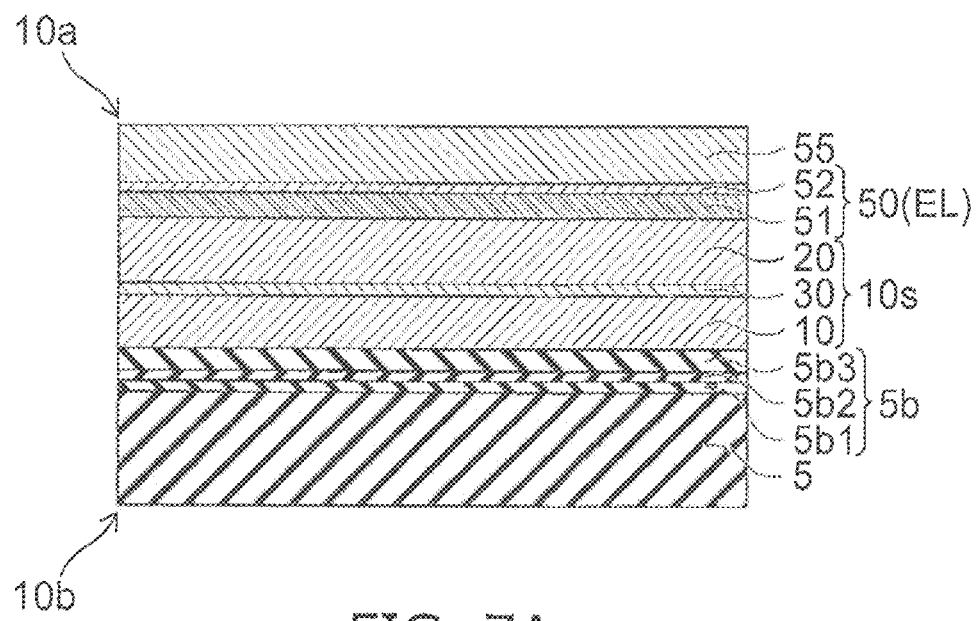
FIGS. 7A and 7B are schematic cross-sectional views illustrating a method for manufacturing the semiconductor light emitting device.
Figure 7B:
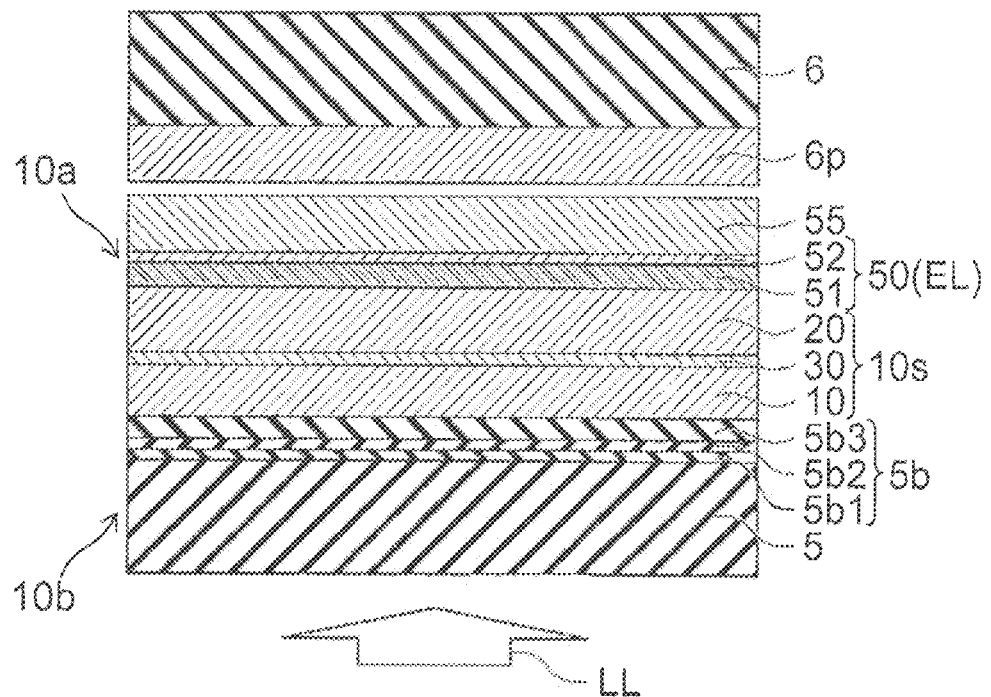

FIGS. 7A and 7B are schematic cross-sectional views illustrating a method for manufacturing the semiconductor light emitting device according to the third embodiment of the invention.

First, similarly to the first and second embodiments, the first semiconductor layer 10, the light emitting layer 30, and the second semiconductor layer 20 are grown as crystals on the substrate 5 to form the stacked structural unit 10s as illustrated in FIG. 7A.

At this time, as illustrated in FIG. 7A, a buffer layer 5b is provided on the substrate 5; and the stacked structural unit 10s is formed thereupon. Specifically, a first AlN buffer layer 5b1, a second AlN buffer layer 5b2, and a non-doped GaN buffer layer 5b3 recited above are formed as the buffer layer 5b on the substrate 5 made of sapphire.

Subsequently, similarly to those recited above, a patterned lift-off resist is formed on the p-type contact layer (e.g., the high concentration Mg-doped p-type GaN contact layer recited above) of the first major surface 10a (on the second semiconductor layer 20 side) of the stacked structural unit 10s; a Ag layer forming the first metal layer 51 (having a thickness of 200 nm) and a Pt layer forming the second metal layer 52 (having a thickness of 2 nm) are continuously formed; and after lift-off, sintering is performed at 380° C. for one minute in a mixed gas atmosphere having an oxygen to nitrogen ratio of 8 to 2. Thereby, the second electrode 50 is formed.

A Ti/Pt/Au stacked film forming the second pad layer 55, for example, is formed with a thickness of, for example, 500 nm to cover the second electrode 50.

Subsequently, as illustrated in FIG. 7B, a Ti/Pt/Au stacked film, for example, is provided with a thickness of, for example, 500 nm as an opposing pad layer 6p on a support member 6 made of silicon and disposed to oppose the stacked structural unit 10s recited above. At this time, the disposition is such that the Au layer of the Ti/Pt/Au stacked film of the second pad layer 55 opposes the Au layer of the Ti/Pt/Au stacked film of the opposing pad layer 6p. The stacked structural unit 10s and the support member 6 are pressed together while being heated to bond the second pad layer 55 to the opposing pad layer 6p.

Then, laser light LL of, for example, a third harmonic (355 nm) or fourth harmonic (266 nm) YVO$_4$ solid-state laser is radiated from the side of the substrate 5 made of sapphire. The laser light LL has a wavelength shorter than the band gap wavelength based on the band gap of the GaN of the GaN buffer layer (e.g., the non-doped GaN buffer layer 5b3 recited above). In other words, the laser light LL has energy higher than the band gap of GaN.

The laser light LL is efficiently absorbed by a region of the GaN buffer layer (the non-doped GaN buffer layer 5b3) on the monocrystalline AlN buffer layer (in this example, the second AlN buffer layer 5b2) side. Thereby, the GaN of the GaN buffer layer on the monocrystalline AlN buffer layer side decomposes due to heat generation.

Then, the decomposed GaN is removed by hydrochloric acid and the like; and the substrate 5 made of sapphire is separated by peeling from the stacked structural unit 10s.

The GaN buffer layer (the non-doped GaN buffer layer 5b3) on the second major surface 10b side of the stacked structural unit 10s from which the substrate 5 was peeled is removed by a method such as polishing, dry etching, and wet etching to expose the n-type contact layer (e.g., the Si-doped n-type GaN contact layer recited above) of the first semiconductor layer 10.

Subsequently, a Ti/Pt/Au stacked film, for example, is formed with a thickness of, for example, 500 nm on the surface of the n-type contact layer by lift-off and the like; and the first electrode 40 is formed by patterning. Then, the surface of the n-type contact layer (the first semiconductor layer 10) on which the first electrode 40 is not formed is patterned by alkaline etching and the like to form the recess/protrusion portion PP.

Then, the semiconductor light emitting device 130 can be constructed by cutting the stacked structural unit 10s by cleaving, with a diamond blade, etc., and separating the devices.

Thus, in the semiconductor light emitting device 130, the stacked structural unit 10s of the semiconductor light emitting device is bonded to the support member 6; the substrate 5 upon which crystal growth was performed is peeled; the peeling surface is processed; and subsequently the first electrode 40 is formed.

In a configuration in which the stacked structural unit 10s on the substrate 5 is bonded to the support member 6, it is necessary for the surface of the electrodes (particularly the second electrode 50) on the stacked structural unit 10s side to have high reflecting characteristics with respect to the emitted light; and sufficiently high adhesion also is necessary. By using the structure according to the embodiments of the invention in such a case, good adhesion, reflecting characteristics, and electrical characteristics can be simultaneously satisfied. Therefore, a semiconductor light emitting device can be realized with high luminance and high reliability.

When bonding the stacked structural unit 10s on the substrate 5 to the support member 6 and using laser light to decompose the GaN layer to peel the substrate 5, crystal defects 29 easily occur excessively in the crystal of the stacked structural unit 10s. It is considered that such crystal defects 29 are caused by, for example, differences in the coefficients of thermal expansion among the support member 6, the sapphire, and the GaN, concentration of heat due to local heating, products created by the decomposition of the GaN, etc.

Thus, in the case where crystal defects 29 and damage occur excessively after the sintering when forming the second electrode 50, the Ag included in the second electrode 50 and the first metal layer 51 may excessively diffuse from such damage and crystal defects 29 toward the stacked structural unit 10s and lead to an acceleratingly remarkable increase in leaks and crystal defects in the crystal interior.

According to the specific examples recited above, a high quality semiconductor layer can be formed by using the monocrystalline AlN buffer layers (in this example, the first AlN buffer layer 5b1 and the second AlN buffer layer 5b2) as the buffer layer 5b. Therefore, damage to the crystal is drastically reduced. When decomposing the GaN layer with laser light, the GaN is disposed proximally to the monocrystalline AlN buffer layer which has high thermal conduction characteristics. Therefore, heat easily diffuses; and thermal damage due to local heating can be suppressed.

Solder such as AuSn may be used as the method for bonding the stacked structural unit 10s on the substrate 5 to the support member 6. The solder generally is formed in a film with a thickness of several μm. Thicker films increase the strain applied to the reflecting electrode (in this example, the second electrode 50). In such a case as well, the configuration of this embodiment has good adhesion with the reflecting electrode and provides good characteristics also when using solder.

Fourth Embodiment

Figure 8:
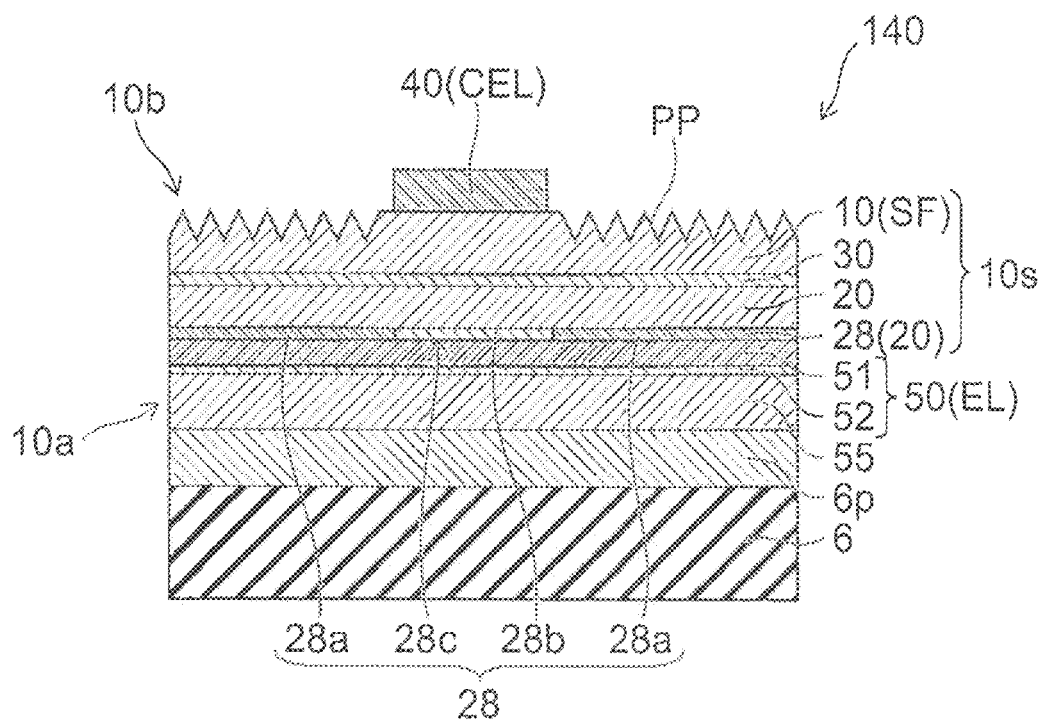
FIG. 8 is a schematic cross-sectional view illustrating the configuration of a semiconductor light emitting device.

FIG. 8 is a schematic cross-sectional view illustrating the configuration of a semiconductor light emitting device according to a fourth embodiment of the invention.

Namely, FIG. 8 is a cross-sectional view of a semiconductor light emitting device 140 cut in the stacking direction of the stacked structural unit 10s of the semiconductor light emitting device 140.

In the semiconductor light emitting device 140, a p-type contact layer 28 (e.g., the high concentration Mg-doped p-type GaN contact layer recited above) of the second semiconductor layer 20 includes a low electrical characteristic portion 28c as illustrated in FIG. 8. The low electrical characteristic portion 28c is selectively provided on the surface (the surface on the first major surface 10a side) of the second electrode 50 side of a portion 28b of the p-type contact layer 28 opposing the first electrode 40.

The low electrical characteristic portion 28c is a portion, for example, of the surface of the p-type contact layer 28 on the first major surface 10a side on which ashing processing is selectively performed. The ashing processing is not performed on portions 28a of the p-type contact layer 28 that does not oppose the first electrode 40.

The surface state of the low electrical characteristic portion 28c is different from that of the other portions 28a. Thereby, the contact resistance Rc increases and the ohmic characteristics deteriorate more for the low electrical characteristic portion 28c than for the other portions 28a due to, for example, performing the ashing processing.

Thus, in addition to the stacked structural unit 10s and the electrode EL (in this example, the second electrode 50), the semiconductor light emitting device 140 further includes the first electrode 40 (an opposing electrode CEL) provided on the side of the first semiconductor layer 10 opposite to the light emitting layer 30.

The second semiconductor layer 20 (in this case, particularly the p-type contact layer 28) includes the low electrical characteristic portion 28c provided on the second electrode 50 (the electrode EL) side of the second semiconductor layer 20 in the region (the portion 28b) opposing the first electrode 40 (the opposing electrode CEL). The low electrical characteristic portion 28c has at least one selected from a higher contact resistance and a lower ohmic characteristic between the second semiconductor layer 20 and the second electrode 50 (the electrode EL) than that of the region (the portions 28a) that does not oppose the first electrode 40 (the opposing electrode CEL).

The semiconductor light emitting device 140 having such a configuration may be constructed, for example, as follows.

Prior to forming the second electrode 50 on the stacked structural unit 10s, a resist is formed on the first major surface 10a of the second semiconductor layer 20 in a patterned configuration to expose the region (the portion 28b) opposing the region where the first electrode 40 will be formed. Subsequently, oxygen asher processing, for example, is performed on the surface of the second semiconductor layer 20 not covered with the resist. The resist is removed; and thereafter, the methods described above may be used to form the semiconductor light emitting device 140.

The asher processing is performed on the low electrical characteristic portion 28c to provide, for example, an increased contact resistance Rc and non-ohmic characteristics such that current does not flow easily. Therefore, current does not flow easily in the light emitting layer 30 in the region opposing the first electrode 40. Thereby, current is not easily injected into the light emitting layer 30 directly below the first electrode 40; the absorption by the first electrode 40 of the light emitted by the light emitting layer 30 can be suppressed; and the efficiency improves.

According to the sintering conditions described above, it is possible to realize extremely good ohmic characteristics and a low contact resistance Rc. Therefore, it is particularly favorable to combine the sintering recited above with control of the current conducting region by the low electrical characteristic portion 28c on which, for example, ashing processing is performed such that a configuration is realized in which substantially no current flows in the low electrical characteristic portion 28c.

The method for controlling the current conducting region by providing the low electrical characteristic portion 28c formed by, for example, selectively performing ashing processing on the surface of the second electrode 50 side of the region (the portion 28b) of the second semiconductor layer 20 (particularly the p-type contact layer 28) opposing the first electrode 40 may be implemented independently from the configuration in which sintering is performed under designated conditions for the combination of the first metal layer 51 and the second metal layer 52 recited above. Thereby, the efficiency improves.

Although the second electrode 50 (the electrode EL) recited above has a configuration including the first metal layer 51 containing Ag and the second metal layer 52 containing the noble metal element, the first electrode 40 (the opposing electrode CEL) may include a first metal layer containing Ag and a second metal layer containing the noble metal element and satisfy the conditions recited above.

Further, each of the first electrode 40 and the second electrode 50 may have the configuration recited above.

Fifth Embodiment

A fifth embodiment of the invention is a method for manufacturing a semiconductor light emitting device including the stacked structural unit 10s which includes: the first semiconductor layer 10 of the first conductivity type including a nitride semiconductor, the second semiconductor layer 20 of the second conductivity type including a nitride semiconductor, and the light emitting layer 30 provided between the first semiconductor layer 10 and the second semiconductor layer 20; and the electrode EL (e.g., the second electrode 50) provided on the side of the second semiconductor layer 20 opposite to the light emitting layer 30.

Figure 9:
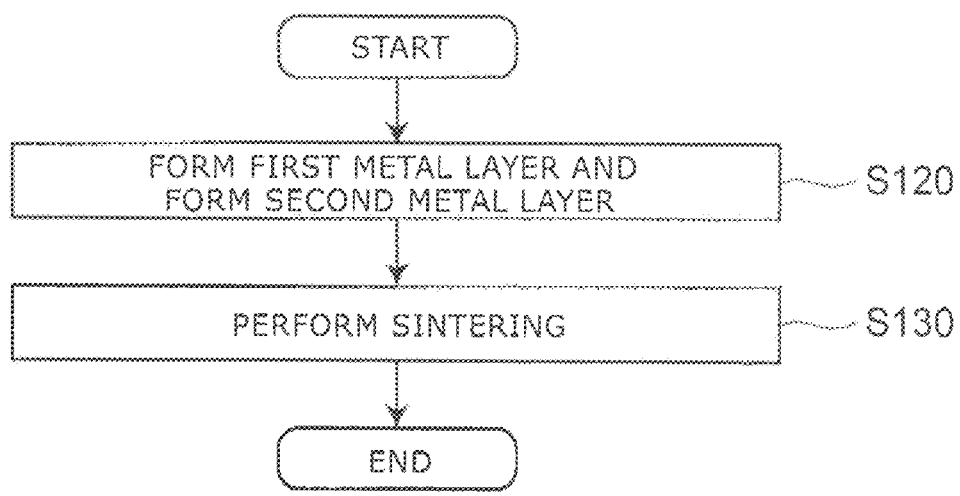
FIG. 9 is a flowchart illustrating the method for manufacturing the semiconductor light emitting device.

FIG. 9 is a flowchart illustrating the method for manufacturing the semiconductor light emitting device according to the fifth embodiment of the invention.

The method for manufacturing the semiconductor light emitting device according to this embodiment includes a process of forming the first metal layer 51 including silver or silver alloy on a surface (the first major surface 10a) on the side of the second semiconductor layer 20 opposite to the light emitting layer 30 and forming the second metal layer 52 including at least one element selected from gold, platinum, palladium, rhodium, iridium, ruthenium, and osmium on the first metal layer 51 (step S120) and a process of sintering the second semiconductor layer 20, the first metal layer 51, and the second metal layer 52 in an atmosphere containing oxygen (step S130) as illustrated in FIG. 9.

The temperature of the sintering process (step S130) is such that the average particle diameter (the grain size Da) of the silver included in the first metal layer 51 after the sintering is not more than three times the average particle diameter prior to the sintering.

As described in regard to FIGS. 4A and 4B, in the case where, for example, the second metal layer 52 includes Pt, it is favorable for the sintering temperature Ts to be less than 560° C. and particularly favorable to be not more than 470° C. In the case where the second metal layer 52 includes Pd, it is favorable for the sintering temperature Ts to be less than 470° C. and particularly favorable to be not more than 380° C.

Thereby, as described in regard to FIGS. 4A and 4B, the contact resistance Rc of the electrode EL (the second electrode 50) can be reduced; the reflectance can be improved; and the adhesion can be improved.

At this time, as described in regard to FIG. 3, it is favorable for the oxygen concentration of the atmosphere of the sintering to be not less than 20%. Thereby, the contact resistance Rc can be reduced; and good ohmic characteristics can be obtained.

Particularly prominent effects can be obtained when the peak wavelength of the light emitted by the light emitting layer 30 is not less than 370 nm and not more than 400 nm. In other words, although the reflectances of metals other than Ag markedly decrease in such a wavelength range, the reflectance of Ag is high; and the effects of using Ag in the first metal layer 51 are prominent.

The first metal layer 51 may be a single-layer film including silver. The second metal layer 52 may include at least one selected from platinum, palladium, and an alloy including platinum and palladium.

Figure 10:
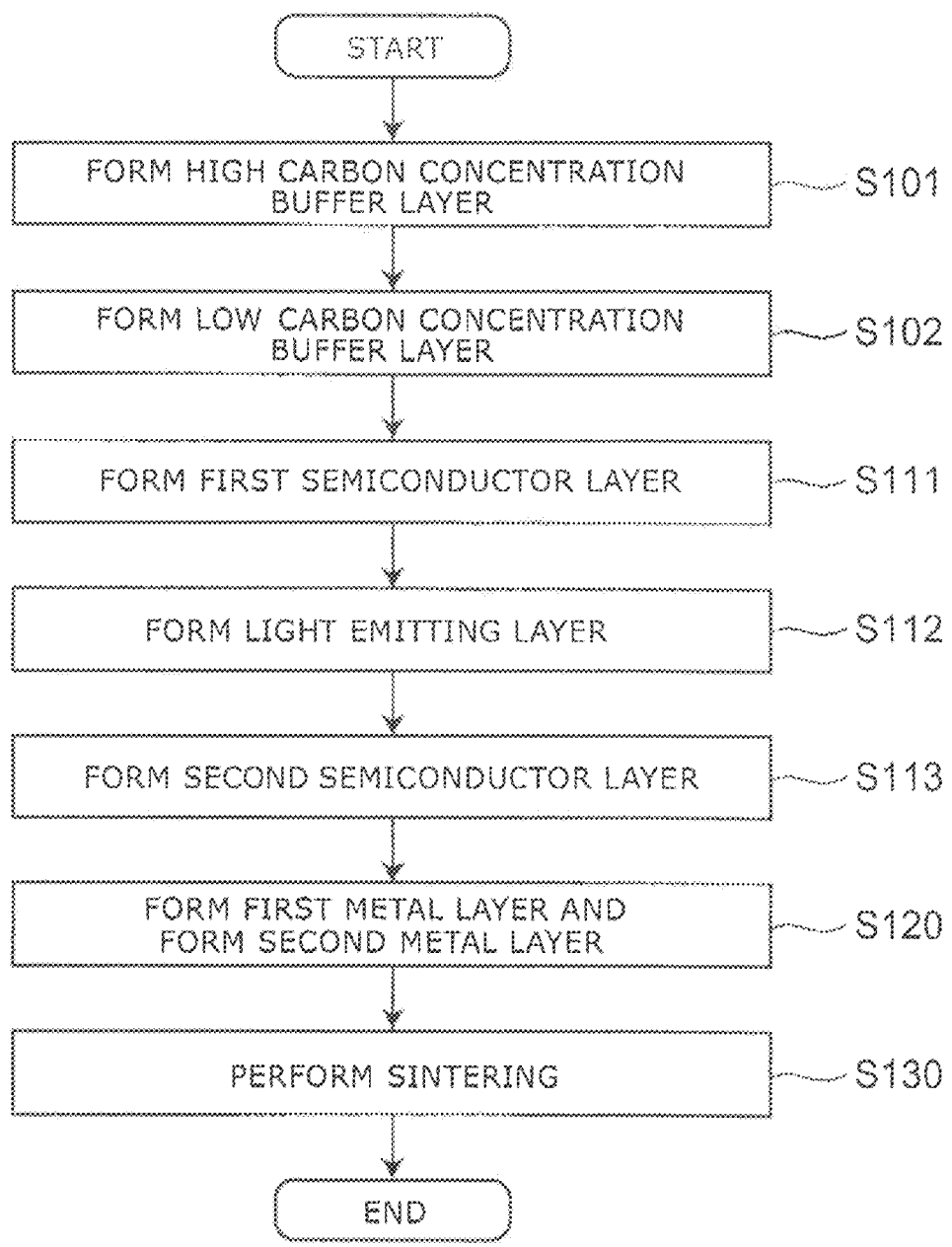
FIG. 10 is a flowchart illustrating a method for manufacturing a semiconductor light emitting device.

FIG. 10 is a flowchart illustrating a method for manufacturing another semiconductor light emitting device according to the fifth embodiment of the invention.

The method for manufacturing the semiconductor light emitting device according to this embodiment further includes the following processes as illustrated in FIG. 10.

A high carbon concentration portion buffer layer (e.g., the first AlN buffer layer 5b1 recited above) including monocrystalline $Al_xGa_{1-x}N$ ($0.8 \leq x \leq 1$) and having a high concentration of carbon is formed on the substrate 5 made of sapphire (step S101).

Then, a low carbon concentration buffer layer (e.g., the second AlN buffer layer 5b2 recited above) including monocrystalline $Al_yGa_{1-y}N$ ($0.8 \leq y \leq 1$) and having a carbon concentration lower than that of the high carbon concentration portion buffer layer recited above is formed on the high carbon concentration portion buffer layer (step S102).

Continuing, the first semiconductor layer 10 is formed on the low carbon concentration buffer layer (step S111).

Then, the light emitting layer 30 is formed on the first semiconductor layer 10 (step S112).

Continuing, the second semiconductor layer 20 is formed on the light emitting layer 30 (step S113).

By using buffer layers such as those recited above, the first semiconductor layer 10, the light emitting layer 30, and the second semiconductor layer 20 having excellent crystallinity can be formed.

As described above, it is favorable for the carbon concentration of the high carbon concentration portion buffer layer to be not less than $3 \times 10^{18}$ cm$^{-3}$ and not more than $5 \times 10^{20}$ cm$^{-3}$ with a thickness of not less than 3 nanometers and not more than 20 nanometers.

Figure 11:
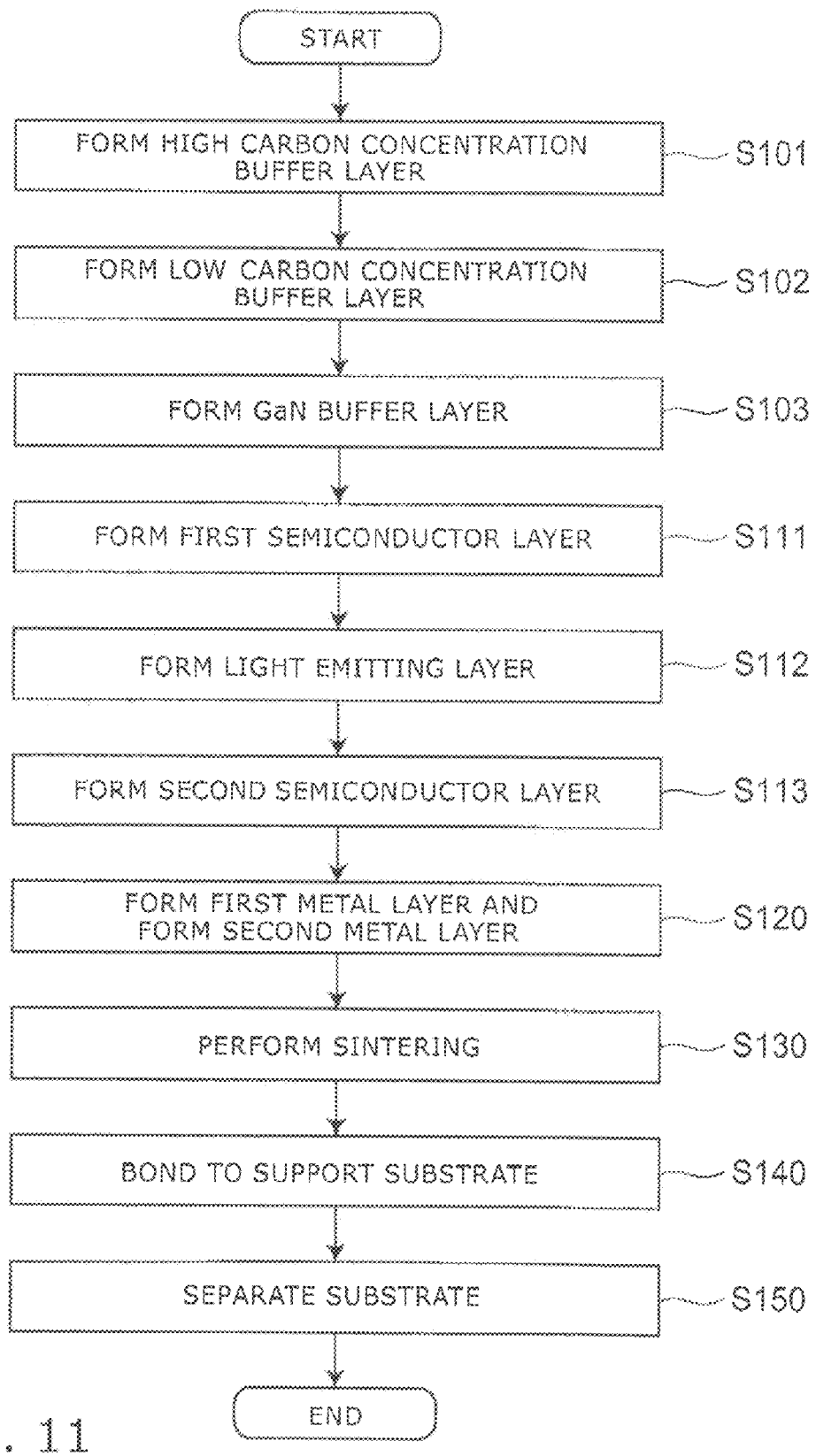
FIG. 11 is a flowchart illustrating a method for manufacturing a semiconductor light emitting device.

FIG. 11 is a flowchart illustrating a method for manufacturing another semiconductor light emitting device according to the fifth embodiment of the invention.

As illustrated in FIG. 11, the method for manufacturing another semiconductor light emitting device according to the fifth embodiment further includes the following processes.

A GaN buffer layer (the non-doped GaN buffer layer 5b3 recited above) including GaN is formed between the low carbon concentration buffer layer and the first semiconductor layer 10 (the first semiconductor layer 10) (step S103).

The electrode EL (the second electrode 50) is caused to oppose the support member 6 and be fixed with respect to the support member 6 (step S140) after the sintering (step S130).

Then, the GaN buffer layer is irradiated from the substrate 5 side with the laser light LL having a wavelength shorter than the band gap wavelength based on the band gap of GaN to change a quality of at least a portion of the GaN buffer layer on the substrate 5 side to separate the substrate 5 from the GaN buffer layer (step S150).

In other words, the processing described in regard to FIG. 7B is performed. According to the manufacturing method of this embodiment, the reflecting characteristics of the second electrode 50 are high and the adhesion is good. Therefore, a semiconductor light emitting device having the configuration in which the support member 6 is provided can be manufactured to obtain high luminance and high reliability.

In the specification, "nitride semiconductor" includes all compositions of nitride semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the composition ratios x, y, and z are changed within the ranges. "Nitride semiconductor" further includes group V elements other than N (nitrogen) in the chemical formula recited above and any of various dopants added to control the conductivity type, etc.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, various modifications made by one skilled in the art in regard to the configurations, sizes, material qualities, arrangements, etc., of components of semiconductor light emitting devices such as light emitting layers, nitride semiconductors, first metal layers, second metal layers, first semiconductor layers, second semiconductor layers, first electrodes, second electrodes, first pad layers, second pad layers, various buffer layers, substrates, and dielectric films or manufacturing methods such as crystal growth processes are included in the scope of the invention to the extent that the purport of the invention is included.

Further, any two or more components of the specific examples may be combined within the extent of technical feasibility; and are included in the scope of the invention to the extent that the purport of the invention is included.

Moreover, all semiconductor light emitting devices and methods for manufacturing semiconductor light emitting devices practicable by an appropriate design modification by one skilled in the art based on the semiconductor light emitting devices and the methods for manufacturing semiconductor light emitting devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

The invention claimed is:

1. A semiconductor light emitting device, comprising:
   a stacked structural unit including a first semiconductor layer of a first conductivity type, a second semiconductor layer of a second conductivity type, and a light emitting layer provided between the first semiconductor layer and the second semiconductor layer, the first semiconductor layer including a nitride semiconductor, the second semiconductor layer including a nitride semiconductor;
   a first electrode including a first metal layer and a second metal layer, the first metal layer including silver or silver alloy and being provided on a side of the second semiconductor layer opposite to the light emitting layer, the second metal layer including at least one element selected from gold, platinum, palladium, rhodium, iridium, ruthenium, and osmium and being provided on a side of the first metal layer opposite to the second semiconductor layer; and a second electrode provided on a side of the first semiconductor layer opposite to the light emitting layer, a concentration of the element in a region including an interface between the first metal layer and the second semiconductor layer being higher than a concentration of the element in a region of the first metal layer distal to the interface, the second semiconductor layer including a first portion provided in a region on the first electrode side of the second semiconductor layer to oppose the second electrode, and a second portion provided in a region on the electrode side of the second semiconductor layer not to oppose the second electrode, a contact resistance between the first portion and the first electrode being higher than a contact resistance between the second portion and the first electrode.

2. The device according to claim 1, wherein an average particle diameter of silver in the first metal layer is not more than 0.3 micrometers.

3. The device according to claim 1, wherein the second semiconductor layer includes an interface layer provided in contact with an interface between the second semiconductor layer and the first metal layer, and the interface layer includes silver.

4. The device according to claim 1, wherein the first metal layer substantially does not include the element.

5. The device according to claim 1, wherein the first metal layer is a single-layer film including silver.

6. The device according to claim 1, wherein the second metal layer includes at least one selected from platinum, palladium, and an alloy including platinum and palladium.

7. The device according to claim 1, wherein a peak wavelength of light emitted from the light emitting layer is not less than 370 nanometers and not more than 400 nanometers.

8. The device according to claim 1, wherein the first semiconductor layer, the light emitting layer, and the second semiconductor layer are formed on a substrate made of sapphire via a buffer layer including monocrystalline $Al_xGa_{1-x}N$ ($0.8 \leq x \leq 1$), the buffer layer includes a high carbon concentration portion provided on the substrate side of the buffer layer, and the high carbon concentration portion has a carbon concentration not less than $3\times10^{18}$ cm$^{-3}$ and not more than $5\times10^{20}$ cm$^{-3}$ and a thickness not less than 3 nanometers and not more than 20 nanometers.

9. A semiconductor light emitting device, comprising:

a stacked structural unit including a first semiconductor layer of a first conductivity type, a second semiconductor layer of a second conductivity type, and a light emitting layer provided between the first semiconductor layer and the second semiconductor layer, the first semiconductor layer including a nitride semiconductor, the second semiconductor layer including a nitride semiconductor;

a first electrode including a first metal layer and a second metal layer, the first metal layer including silver or silver alloy and being provided on a side of the second semiconductor layer opposite to the light emitting layer, the second metal layer including at least one element selected from gold, platinum, palladium, rhodium, iridium, ruthenium, and osmium and being provided on a side of the first metal layer opposite to the second semiconductor layer; and a second electrode provided on a side of the first semiconductor layer opposite to the light emitting layer, the second semiconductor layer including an interface layer provided in contact with an interface between the second semiconductor layer and the first metal layer, the interface layer including silver, the second semiconductor layer including a first portion provided in a region on the first electrode side of the second semiconductor layer to oppose the second electrode, and a second portion provided in a region on the first electrode side of the second semiconductor layer not to oppose the second electrode, a contact resistance between the first portion and the first electrode being higher than a contact resistance between the second portion and the first electrode.

10. The device according to claim 9, wherein an average particle diameter of silver in the first metal layer is not more than 0.3 micrometers.

11. The device according to claim 9, wherein the first metal layer substantially does not include the element.

12. The device according to claim 9, wherein the first metal layer is a single-layer film including silver.

13. The device according to claim 9, wherein the second metal layer includes at least one selected from platinum, palladium, and an alloy including platinum and palladium.

14. The device according to claim 9, wherein a peak wavelength of light emitted from the light emitting layer is not less than 370 nanometers and not more than 400 nanometers.

15. The device according to claim 9, wherein the first semiconductor layer, the light emitting layer, and the second semiconductor layer are formed on a substrate made of sapphire via a buffer layer including monocrystalline $Al_xGa_{1-x}N$ ($0.8 \leq x \leq 1$), the buffer layer includes a high carbon concentration portion provided on the substrate side of the buffer layer, and the high carbon concentration portion has a carbon concentration not less than $3\times10^{18}$ cm$^{-3}$ and not more than $5\times10^{20}$ cm$^{-3}$ and a thickness not less than 3 nanometers and not more than 20 nanometers.

16. A semiconductor light emitting device, comprising:

a stacked structural unit including a first semiconductor layer of a first conductivity type, a second semiconductor layer of a second conductivity type, and a light emitting layer provided between the first semiconductor layer and the second semiconductor layer, the first semiconductor layer including a nitride semiconductor, the second semiconductor layer including a nitride semiconductor;

a first electrode including a first metal layer and a second metal layer, the first metal layer including silver or silver alloy and being provided on a side of the second semiconductor layer opposite to the light emitting layer, the second metal layer including at least one element selected from gold, platinum, palladium, rhodium, iridium, ruthenium, and osmium and being provided on a side of the first metal layer opposite to the second semiconductor layer; and a second electrode provided on a side of the first semiconductor layer opposite to the light emitting layer, a concentration of the element in a region including an interface between the first metal layer and the second semiconductor layer being higher than a concentration of the element in a region of the first metal layer distal to the interface, the second semiconductor layer including
  a first portion provided in a region on the first electrode side of the second semiconductor layer to oppose the second electrode, and
  a second portion provided in a region on the first electrode side of the second semiconductor layer not to oppose the second electrode,
  the first portion forming a non-ohmic contact with the first electrode, and
  the second portion forming an ohmic contact with the first electrode.

17. The device according to claim 16, wherein an average particle diameter of silver in the first metal layer is not more than 0.3 micrometers.

18. The device according to claim 16, wherein the second semiconductor layer includes an interface layer provided in contact with an interface between the second semiconductor layer and the first metal layer, the interface layer includes silver.

19. The device according to claim 16, wherein the first metal layer substantially does not include the element.

20. The device according to claim 16, wherein the first metal layer is a single-layer film including silver.

21. The device according to claim 16, wherein the second metal layer includes at least one selected from platinum, palladium, and an alloy including platinum and palladium.

22. The device according to claim 16, wherein a peak wavelength of light emitted from the light emitting layer is not less than 370 nanometers and not more than 400 nanometers.

23. The device according to claim 16, wherein the first semiconductor layer, the light emitting layer, and the second semiconductor layer are formed on a substrate made of sapphire via a buffer layer including monocrystalline $Al_xGa_{1-x}N$ ($0.8 \leq x \leq 1$), the buffer layer includes a high carbon concentration portion provided on the substrate side of the buffer layer, and the high carbon concentration portion has a carbon concentration not less than $3 \times 10^{18}$ cm$^{-3}$ and not more than $5 \times 10^{20}$ cm$^{-3}$ and a thickness not less than 3 nanometers and not more than 20 nanometers.

24. A semiconductor light emitting device, comprising:
  a stacked structural unit including a first semiconductor layer of a first conductivity type, a second semiconductor layer of a second conductivity type, and a light emitting layer provided between the first semiconductor layer and the second semiconductor layer, the first semiconductor layer including a nitride semiconductor, the second semiconductor layer including a nitride semiconductor;
  a first electrode including a first metal layer and a second metal layer, the first metal layer including silver or silver alloy and being provided on a side of the second semiconductor layer opposite to the light emitting layer, the second metal layer including at least one element selected from gold, platinum, palladium, rhodium, iridium, ruthenium, and osmium and being provided on a side of the first metal layer opposite to the second semiconductor layer; and
  a second electrode provided on a side of the first semiconductor layer opposite to the light emitting layer,
  the second semiconductor layer including an interface layer provided in contact with an interface between the second semiconductor layer and the first metal layer, the interface layer including silver,
  a first portion provided in a region on the first electrode side of the second semiconductor layer to oppose the second electrode, and
  a second portion provided in a region on the first electrode side of the second semiconductor layer not to oppose the second electrode,
  the first portion forming a non-ohmic contact with the first electrode, and
  the second portion forming an ohmic contact with the first electrode.

25. The device according to claim 24, wherein an average particle diameter of silver in the first metal layer is not more than 0.3 micrometers.

26. The device according to claim 24, wherein the first metal layer substantially does not include the element.

27. The device according to claim 24, wherein the first metal layer is a single-layer film including silver.

28. The device according to claim 24, wherein the second metal layer includes at least one selected from platinum, palladium, and an alloy including platinum and palladium.

29. The device according to claim 24, wherein a peak wavelength of light emitted from the light emitting layer is not less than 370 nanometers and not more than 400 nanometers.

30. The device according to claim 24, wherein the first semiconductor layer, the light emitting layer, and the second semiconductor layer are formed on a substrate made of sapphire via a buffer layer including monocrystalline $Al_xGa_{1-x}N$ ($0.8 \leq x \leq 1$), the buffer layer includes a high carbon concentration portion provided on the substrate side of the buffer layer, the high carbon concentration portion has a carbon concentration not less than $3 \times 10^{18}$ cm$^{-3}$ and not more than $5 \times 10^{20}$ cm$^{-3}$ and a thickness not less than 3 nanometers and not more than 20 nanometers.

* * * * *